United States Patent
Singleton et al.

(10) Patent No.: US 10,790,160 B2
(45) Date of Patent: Sep. 29, 2020

(54) BARRIER CONFIGURATIONS AND PROCESSES IN LAYER STRUCTURES

(71) Applicant: SMARTRAC TECHNOLOGY GmbH, Dresden (DE)

(72) Inventors: Laurence Singleton, Dresden (DE); Ray Freeman, Mesa, AZ (US)

(73) Assignee: SMARTRAC TECHNOLOGY GmbH (DE)

( * ) Notice: Subject to any disclaimer, the term of this patent is extended or adjusted under 35 U.S.C. 154(b) by 45 days.

(21) Appl. No.: 15/152,544

(22) Filed: May 11, 2016

(65) Prior Publication Data

US 2016/0336198 A1 Nov. 17, 2016

Related U.S. Application Data

(60) Provisional application No. 62/160,594, filed on May 12, 2015.

(51) Int. Cl.
*H01L 21/56* (2006.01)
*H01L 23/31* (2006.01)
*H01L 23/00* (2006.01)

(52) U.S. Cl.
CPC ........ *H01L 21/561* (2013.01); *H01L 23/3121* (2013.01); *H01L 23/564* (2013.01); *H01L 2224/81* (2013.01)

(58) Field of Classification Search
CPC ..... H01L 2924/00014; H01L 2924/181; H01L 2224/97
See application file for complete search history.

(56) References Cited

U.S. PATENT DOCUMENTS

| 2007/0190689 A1* | 8/2007 | Kaneko | H01L 21/6836 438/108 |
| 2008/0242000 A1* | 10/2008 | Kwon | H01L 24/96 438/114 |
| 2009/0142227 A1* | 6/2009 | Fuchs | C23C 16/4485 422/50 |
| 2011/0221055 A1* | 9/2011 | Lin | H01L 21/76879 257/692 |
| 2014/0077344 A1* | 3/2014 | Pagaila | H01L 23/5389 257/659 |
| 2014/0232519 A1* | 8/2014 | Allen | G06Q 10/08 340/5.9 |
| 2016/0225944 A1* | 8/2016 | Nishimura | H01L 33/0095 |
| 2016/0282609 A1* | 9/2016 | Hanaoka | G02B 26/0841 |

* cited by examiner

*Primary Examiner* — Jaehwan Oh
(74) *Attorney, Agent, or Firm* — Tue Nguyen; Patent2IP LLC

(57) ABSTRACT

This invention relates generally to ID frequency identification (RFID) transponders and receivers. More specifically to the methods, apparatus and systems of the fabrication of the transponders and receivers. In one example embodiment, to methods, apparatus, and systems to form effective barriers for devices having a layer structure, including encapsulating at least a portion of the side of the devices from being degraded due to impurity penetration into a laminate structure of the devices, which can cause corrosion or malfunction of the devices.

20 Claims, 27 Drawing Sheets

```
┌─────────────────────────────────────────────────────┐
│ Determining a degradation path from a singulation   │
│                   side to a device                  │
│                        300                          │
└─────────────────────────────────────────────────────┘
                          │
                          ▼
┌─────────────────────────────────────────────────────┐
│ Blocking the degradation path with an encapsulation │
│                      coating                        │
│                        310                          │
└─────────────────────────────────────────────────────┘
                          │
                          ▼
┌─────────────────────────────────────────────────────┐
│                Singulating the device               │
│                        320                          │
└─────────────────────────────────────────────────────┘
```

*FIG. 3A*

```
┌─────────────────────────────────────────────────────┐
│        Forming one or more layers on a substrate    │
│                        340                          │
└─────────────────────────────────────────────────────┘
                          │
                          ▼
┌─────────────────────────────────────────────────────┐
│        Removing a portion of the one or more layers │
│                        350                          │
└─────────────────────────────────────────────────────┘
                          │
                          ▼
┌─────────────────────────────────────────────────────┐
│   Forming an encapsulation coating, wherein the     │
│ encapsulation coating covers an exposed portion of  │
│                   the removed portion               │
│                        360                          │
└─────────────────────────────────────────────────────┘
                          │
                          ▼
┌─────────────────────────────────────────────────────┐
│     Singulating the substrate at the removed portion│
│                        370                          │
└─────────────────────────────────────────────────────┘
```

*FIG. 3B*

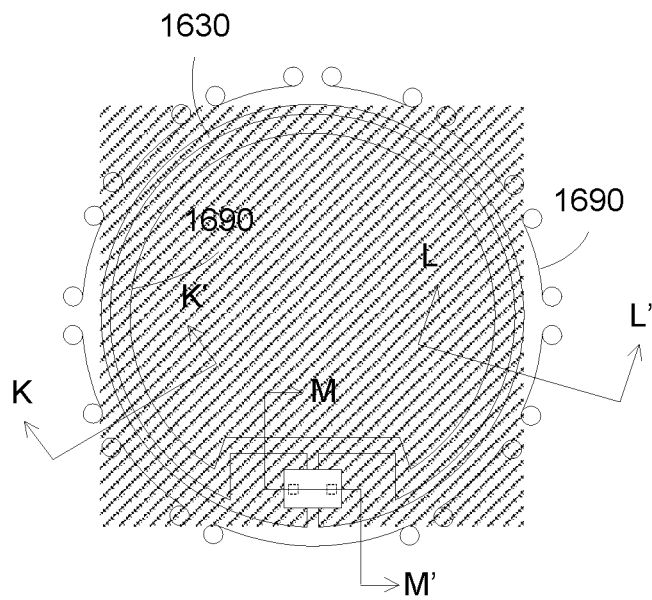
FIG. 16A
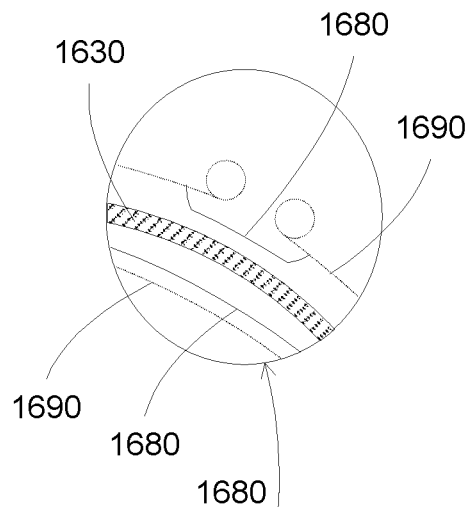
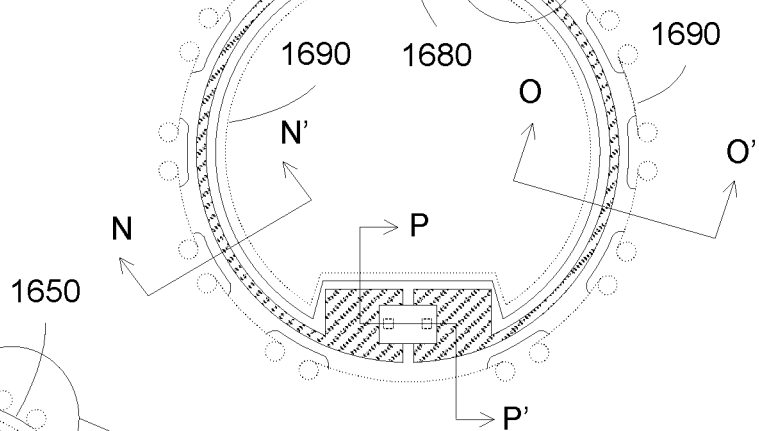
FIG. 16B
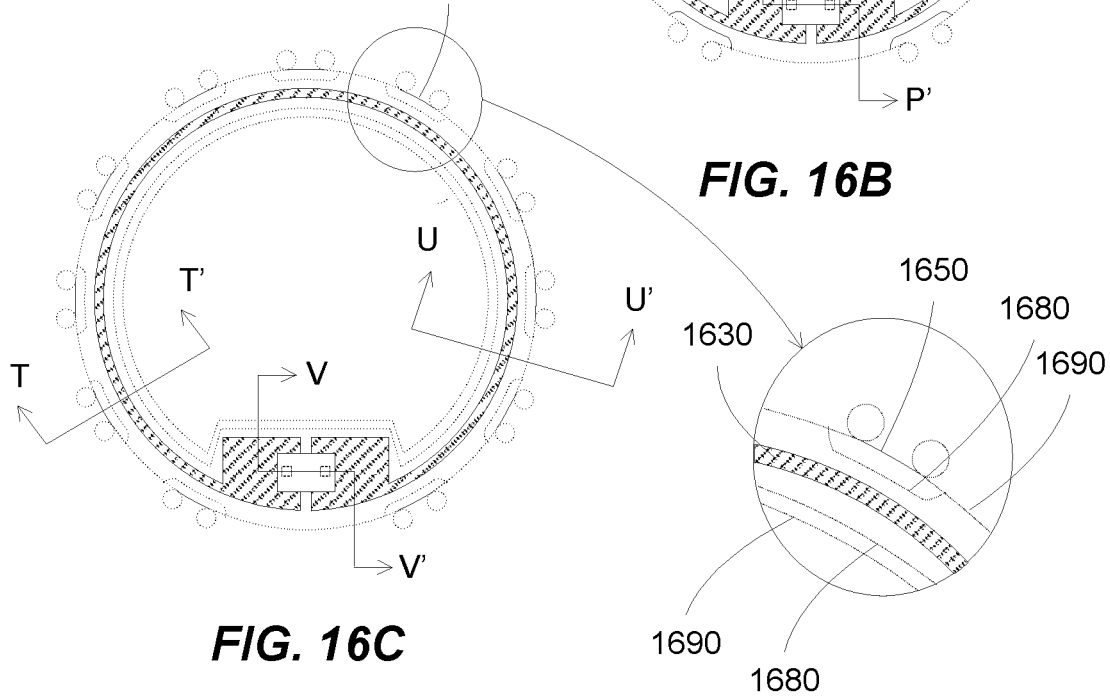
FIG. 16C

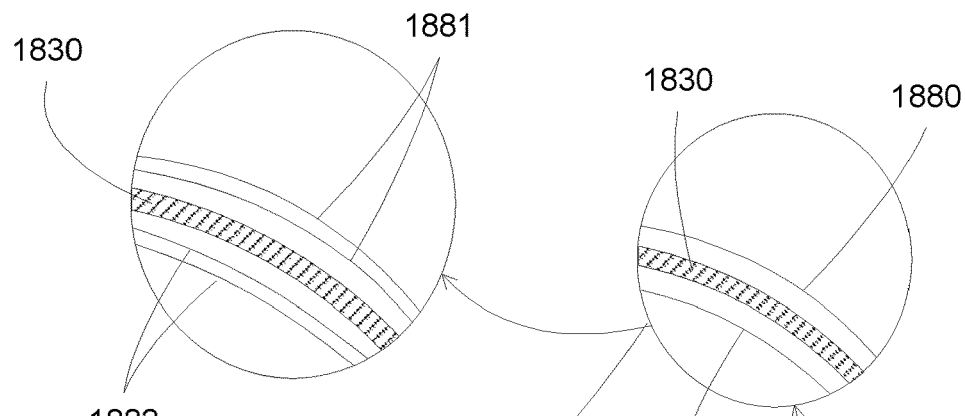
FIG. 18C
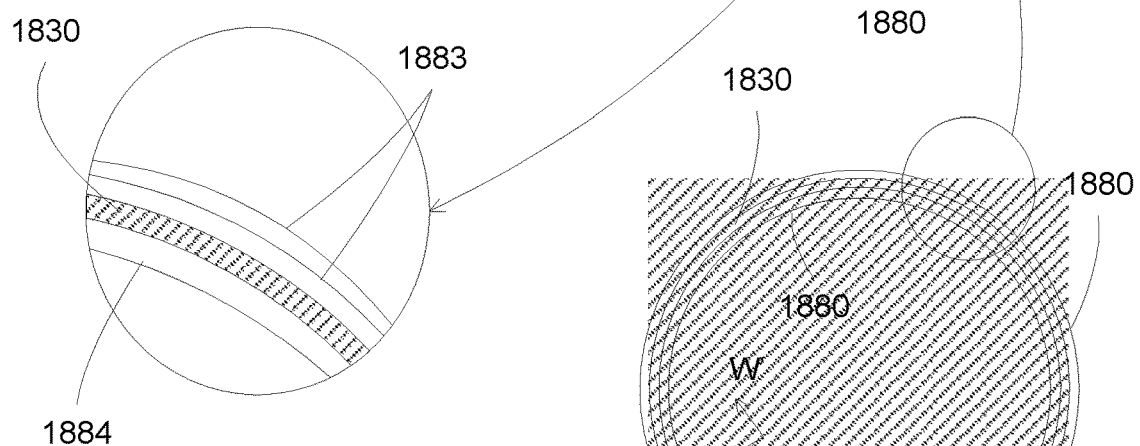
FIG. 18D
FIG. 18A
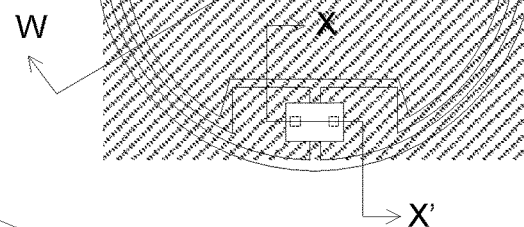
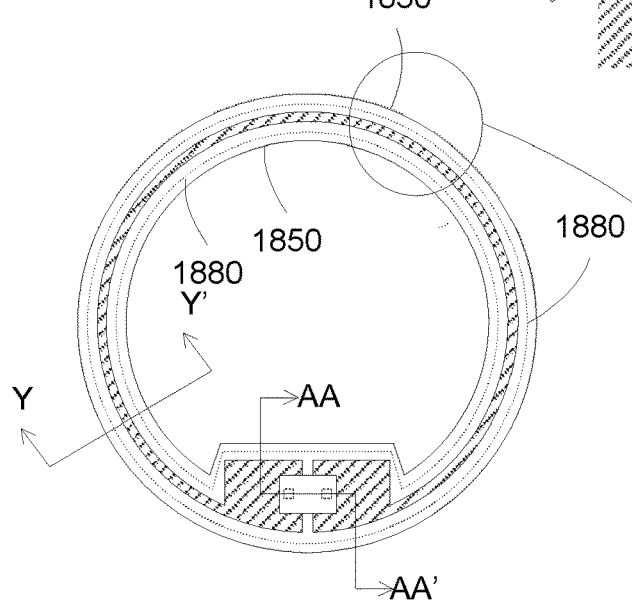
FIG. 18B
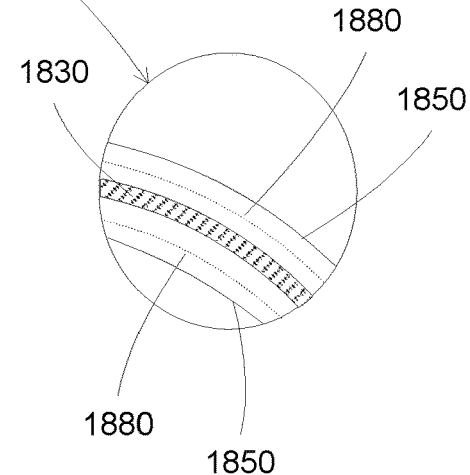

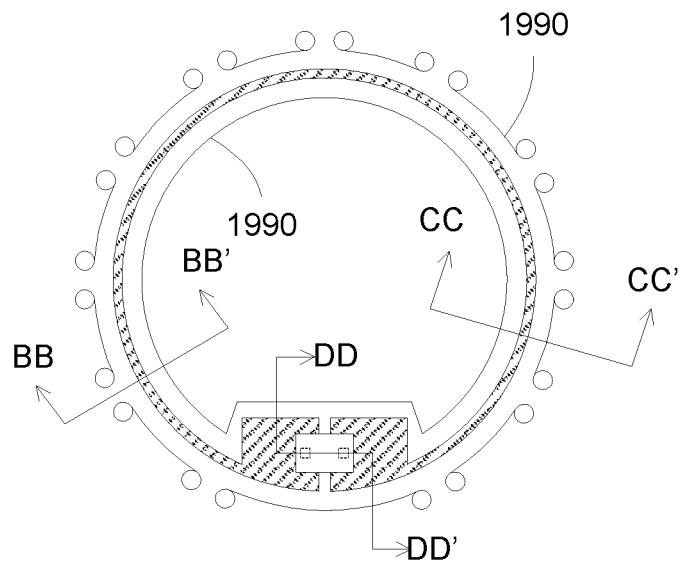
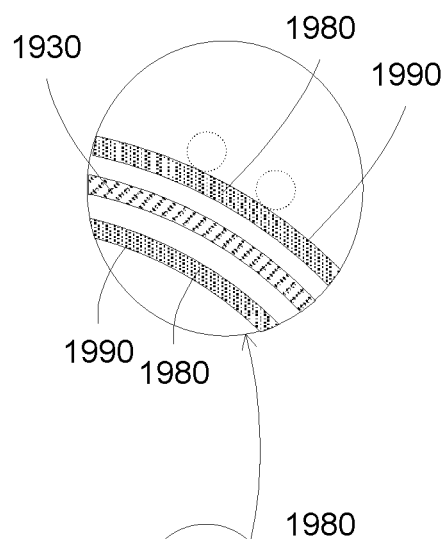
FIG. 19A
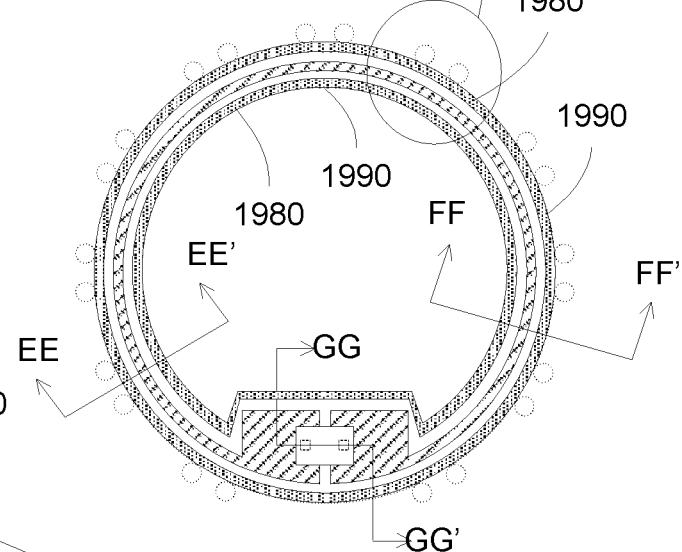
FIG. 19B
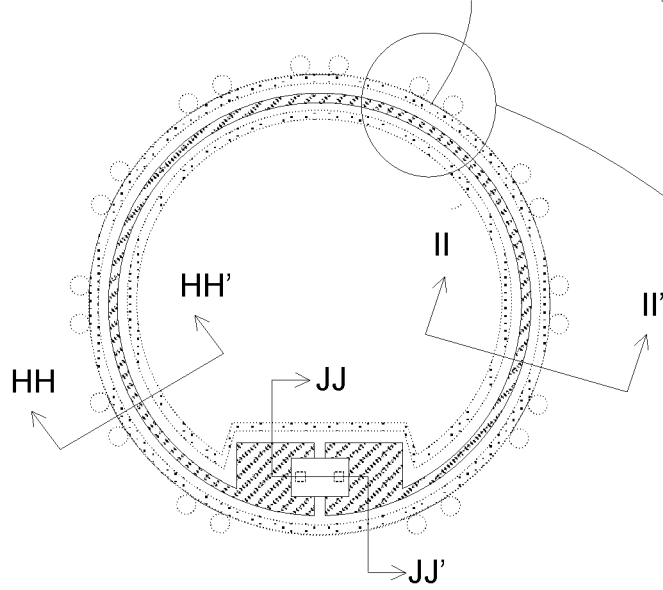
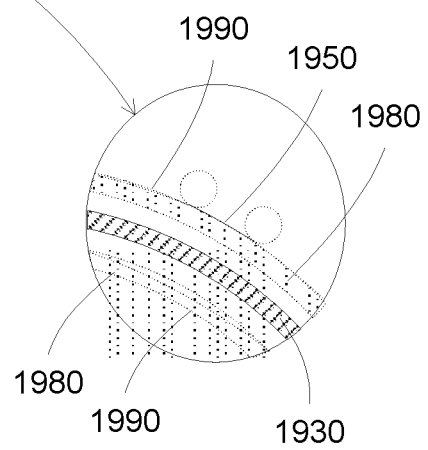
FIG. 19C

BARRIER CONFIGURATIONS AND PROCESSES IN LAYER STRUCTURES

This application claims priority from provisional patent application Ser. No. 62/160,594, filed on May 12, 2015, entitled "Barrier Configurations and Processes in Layer Structures", which applications are incorporated herein by reference in their entirety for all purposes.

FIELD OF TECHNOLOGY

This disclosure relates generally to radio-frequency identification (RFID) transponders and receivers. More specifically to the methods, apparatus and systems of the fabrication of the transponders and receivers. In one example embodiment, to methods, apparatus, and systems to form effective barriers for devices such as RFID devices, having a layer structure, including encapsulating at least a portion of the side of the devices from being degraded due to impurity penetration into a laminate structure of the devices, which can cause corrosion or malfunction of the devices.

BACKGROUND

Within many fields radio frequency identification (RFID) transponders receivers, or tags can be used to track materials, for example, during shipping and storage. In an RFID tag interrogation process, an RFID reader can generate an electromagnetic energy, through a reader antenna, towards the item to be tracked. An antenna on the RFID tag can pick up the energy, and an integrated circuit (IC) in the RFID tag can transmit information through the tag antenna back to the reader.

Ultra-High Frequency (UHF) RFID can use radio frequencies of 433 MHz, 865-950 MHz, and the GHz range. In this frequency range, the RF can propagate efficiently with a reasonable amount of power consumption, and can be produced inexpensively.

The RFID transponders can include an antenna connected to an RFID integrated circuit (IC), as well as additional devices like sensors, and can be fabricated by a roll-to-roll process. In a typical roll-to-roll processing technology, the RFID transponders can be disposed on a substrate of a polyethylene terephthalate (PET) material, for example, through a layer of an adhesive material. The PET substrate can function as the carrier for electronic components, e.g., the antenna and the RFID IC, but can be also the transporting web material. The antenna can include all conventional form factors like coil, loop, split loop, dipole, folded dipole, curved dipole, as well as slot and open slots. After the RFID transponders are finished processing, including coating the entire transporting web roll, including the RFID transponders disposed on the transporting web roll, with an encapsulation layer, the individual RFID transponders are singulated from the transporting web roll, for example, by a laser cutting process.

The laser singulation process can expose a side of the RFID transponders, and via this exposed area, moisture or ionic fluids can diffuse to the RFID transponder connected elements, potentially causing corrosion and improper electrical function or malfunction.

FIGS. 1A-1C illustrate a prior art roll-to-roll process for fabricating RFID transponders according to some embodiments. FIG. 1A shows a substrate 110 of a PET material supporting multiple RFID devices 130 through an adhesive layer 120. After the RFID devices are complete processed, an encapsulating layer 140, such as a moisture barrier layer, can be deposited on the whole substrate, e.g., on the top surface and on the bottom surface of the substrate 110, covering also the RFID devices. The encapsulating layer 140 can prevent moisture absorption, which may degrade the adhesion of the adhesive layer 120 and damage both the antenna structure (corrosion) and have negative impact on the electrical interconnections of the RFID device.

In FIG. 1B, a singulation process can be performed, for example, by a laser cutting 150, which can separate the RFID devices 130 into individual devices. The laser cutting 150 can cut between the RFID devices, such as through the encapsulation layer 140, the adhesive layer 120 and the substrate 110. FIG. 1C shows two portions of the substrate after being cut. The encapsulating layer 140 can protect the devices 130 at the top and bottom surfaces, e.g., preventing moisture diffusion 170 from the top and bottom surfaces.

However, the laser cutting or other methods of singulation like punching can expose a side surface 165 of the singulated RFID device. And through the exposed surface 165, moisture can diffuse 160 to the adhesive layer 140, degrading the adhesion of the adhesive layer, damaging and corroding elements of the RFID device 130 on the substrate 110. Moreover, through the exposed surface 165, moisture can directly ingress or infiltrate the laminate structure, thus exerting a detrimental effect to or causing a malfunction of the electronic components.

Thus there is a need for improved RFID transponder processing.

SUMMARY

Disclosed are methods, apparatus, and systems that provide the improved radio-frequency identification (RFID) devices and elements and the fabrication of RFID devices and elements. In summary, the present invention provides in embodiments, the system, method or apparatus to form effective barriers for devices such as RFID devices, having a layer structure, including encapsulating at least a portion of the side of the devices from being degraded due to impurity penetration into a laminate structure of the devices, which can cause corrosion or malfunction of the devices.

This includes an improvement over the prior art, which teaches towards coating an RFID and associated layers and devices, and then cut or otherwise machine or modify the devices during production, and as such a side or sides of the device inner layers may be exposed, such that the RFID devices may be exposed or the adhesive layer may be exposed, such that the devices or layers may be exposed and may ruined, for instance the adhesive layer degrading, or otherwise damaged by undesirable elements or external forces, such as water or dust. The present invention provides a method in one or more embodiments that is unique over the prior art, where the methods, systems or apparatuses which may form barriers that may cover or encapsulate the RFID devices wherein, a portion of the adhesive layer can be removed, such as on a diffusion path from the exposed side, and can be encapsulated with the encapsulating layer before the devices are singulated, and thus the RFID is encapsulated completely providing for complete protection from external forces or elements.

The apparatus, methods or system can include encapsulating at least a portion of the side of the devices before separating the devices from the substrate such that the encapsulating portion can form a barrier for the devices after the separation process. The encapsulating barrier can protect the devices from being degraded due to impurity penetration, which can cause corrosion or malfunction of the devices.

Additionally, the apparatus, method or system may provide abilities for identifying layers that can be susceptible to impurity penetration and then encapsulating the recognized layers to enhance the barrier characteristics of the singulated devices against impurity diffusion or penetration, In summary, the present invention provides a new and unique method, apparatus and system to provide for a finished RFID device, wherein the device is encapsulated such that outside forces or elements are impeded from degrading or damaging the device, and includes methods, systems or apparatuses such that the device may be produced, modified, and subsequently encapsulated completely, including using sensors or other device, such that especially weak areas or areas susceptible to damage, may be encapsulated.

The methods and systems disclosed herein may be implemented in any means for achieving various aspects. Other features will be apparent from the accompanying drawings and from the detailed description that follows.

BRIEF DESCRIPTION OF THE DRAWINGS

Example embodiments are illustrated by way of example and are not limited to the figures of the accompanying drawings, in which, like references indicate similar elements.

FIGS. 3A-3B illustrate flow charts for device singulation processes with improved diffusion barrier properties according to some embodiments.

FIGS. 16A-16C illustrates top down views and section views of a process for forming RFID devices having improved reliability according to some embodiments.

FIGS. 18A-18D illustrate top down views and section views of a process for forming RFID devices having improved reliability according to some embodiments.

FIGS. 19A-19C illustrate top down views and section views of a process for forming RFID devices having improved reliability according to some embodiments.

Figure 1A:
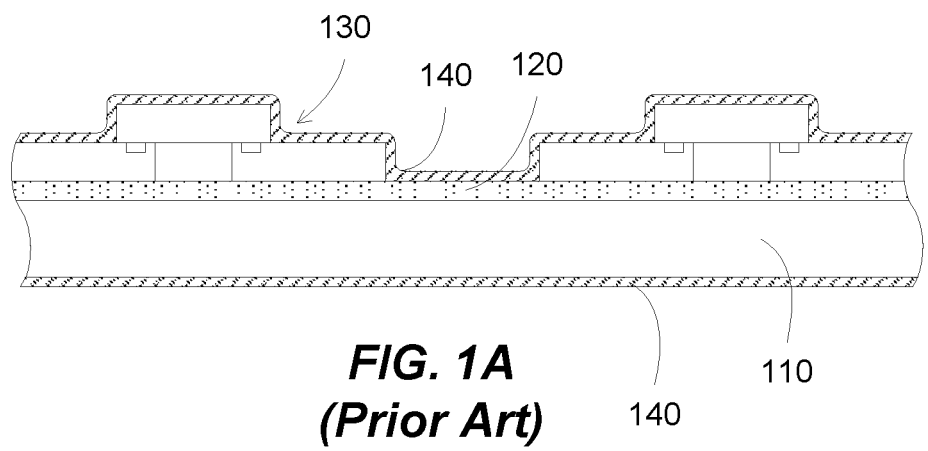
FIGS. 1A-1C illustrate a side cross-section views of a prior art roll-to-roll process for fabricating RFID transponders according to some embodiments.

Other features of the present embodiments will be apparent from the accompanying drawings and from the detailed description that follows.

DETAILED DESCRIPTION

Disclosed are methods, apparatus, and systems that may form effective barriers for radio-frequency identification (RFID) devices having a layer structure, including encapsulating at least a portion of the side of the devices from being degraded due to impurity penetration into a laminate structure of the devices, which can cause corrosion or malfunction of the devices.

In one or more embodiments, which may be combined with the above and below embodiments, the present invention discloses methods, systems or apparatuses which may form a barrier for a device.

In one or more embodiments, which may be combined with the above and below embodiments, the present invention discloses methods, systems or apparatuses which may form a barrier for devices.

In one or more embodiments, which may be combined with the above and below embodiments, the present invention discloses methods, systems or apparatuses which may form barriers for devices.

In one or more embodiments, which may be combined with the above and below embodiments, the present invention discloses methods, systems or apparatuses which may form barriers for devices wherein the devices are RFID devices.

In one or more embodiments, which may be combined with the above and below embodiments, the present invention discloses methods, systems or apparatuses which may form barriers for devices wherein the devices are RFID transponders.

In one or more embodiments, which may be combined with the above and below embodiments, the present invention discloses methods, systems or apparatuses which may form barriers for devices wherein the devices are RFID transponders, receivers and integrated circuits.

In one or more embodiments, which may be combined with the above and below embodiments, the present invention discloses methods, systems or apparatuses which may form barriers for devices wherein the devices are layered.

In one or more embodiments, which may be combined with the above and below embodiments, the present invention discloses methods, systems or apparatuses which may form barriers for devices wherein the devices are thin film devices.

In one or more embodiments, which may be combined with the above and below embodiments, the present invention discloses methods, systems or apparatuses which may form barriers for devices wherein the devices are thin film devices fabricated on a substrate.

In one or more embodiments, which may be combined with the above and below embodiments, the present invention discloses methods, systems or apparatuses which may form barriers that may cover or encapsulate the device or devices.

In one or more embodiments, which may be combined with the above and below embodiments, the present invention discloses methods, systems or apparatuses which may form barriers that may cover or encapsulate devices and wherein the barriers are layered.

In one or more embodiments, which may be combined with the above and below embodiments, the present invention discloses methods, systems or apparatuses which may form barriers that may cover or encapsulate devices and wherein the barriers are a single or monobloc structure.

In one or more embodiments, which may be combined with the above and below embodiments, the present invention discloses methods, systems or apparatuses which may form barriers that may cover or encapsulate devices to protect the devices from interference with elements such as water, damage such as scratches, undesirable forces such as shock, or any other aspects.

In one or more embodiments, which may be combined with the above and below embodiments, the present invention discloses methods, systems or apparatuses which may form barriers that may cover or encapsulate devices and wherein the barrier is made out of any material such as a polymers such as plastic, and may be specifically parylene or polyolefin coatings as well as polymer silicones, or a composite of multiple materials or elements, which also may include metals and any other element or material, which suits the purpose, such as for increased strength etc.

It is noted that in one or more embodiments, the application of the encapsulating coating may be in any method such as chemical or physical vapor deposition, vacuum deposition, plasma enhanced deposition, screen printing, ink jetting, roll-to-roll, spray on, wipe on, immersion, or any other known or currently unknown method.

It is noted that in one or more embodiments, the application of the encapsulating coating may be in any method and may be performed more than once, as to provide for a multiple layer encapsulating barrier.

In one or more embodiments, which may be combined with the above and below embodiments, the present invention discloses methods, systems or apparatuses which may form barriers that may cover or encapsulate devices and may protect the devices from being degraded such as due to impurity penetration such as water or moisture diffusion into a portion of the device such as the adhesive portions, or through other forms of impurity penetration such as direct ingress infiltration, penetration of fluid, such as liquid or liquid vapor such as water or electrolysis from any portion of the device or devices such as the laminate structure of the devices, of which may cause corrosion or malfunction of the device.

In one or more embodiments, which may be combined with the above and below embodiments, the present invention discloses methods, systems or apparatuses which may form barriers that may cover or encapsulate devices wherein the devices or at least a portion of the devices, such as on a side or sides of the devices, are encapsulated before separating the devices from the substrate.

In one or more embodiments, which may be combined with the above and below embodiments, the present invention discloses methods, systems or apparatuses which may form barriers that may cover or encapsulate devices wherein the devices or at least a portion of the devices, such as on a side or sides of the device or devices are encapsulated after separating the devices from the substrate.

In one or more embodiments, which may be combined with the above and below embodiments, the present invention discloses methods, systems or apparatuses which may form barriers that may cover or encapsulate devices wherein, in encapsulating a device, a system, method or apparatus may scan and identify area susceptible to degradation or damage from outside sources by optical, tactile, electrical, or other possible methods.

In one or more embodiments, which may be combined with the above and below embodiments, the present invention discloses methods, systems or apparatuses which may form barriers that may cover or encapsulate devices wherein, in encapsulating a device, a system, method or apparatus may scan and identify area susceptible to degradation or damage from outside sources using identifying lasers or other identifying sensors or transmitters.

In one or more embodiments, which may be combined with the above and below embodiments, the present invention discloses methods, systems or apparatuses which may form barriers that may cover or encapsulate devices wherein, in encapsulating a device, a system, method or apparatus may scan and identify area susceptible to degradation or damage from outside sources using identifying lasers or other identifying sensors or transmitters and of which areas of the device which are more susceptible to damage or penetration, may be sensed and subsequently encapsulated, repetitively encapsulated or wherein the entire device, large area of the device, or the single targeted area is encapsulate or repetitively encapsulated.

In one or more embodiments, which may be combined with the above and below embodiments, the present invention discloses methods, systems or apparatuses which may form barriers that may cover or encapsulate devices wherein, a portion of the adhesive layer can be removed, such as on a diffusion path from the exposed side, and can be encapsulated with the encapsulating layer before the devices are singulated.

In one or more embodiments, which may be combined with the above and below embodiments, the present invention discloses methods, systems or apparatuses fabricated from the methods, to form effective barriers for devices having a layer structure, such as thin film devices fabricated on a substrate. The methods can include encapsulating at least a portion of the side of the devices before separating the devices from the substrate. The encapsulating portion can form a barrier for the devices after the separation process. The encapsulating barrier can protect the devices from being degraded due to impurity penetration, such as water or moisture diffusion into an adhesive portion of the device, or other forms of impurity penetration, such as direct ingress, infiltration, penetration of fluid, e.g., liquid or liquid vapor such as water or electrolytes, into a laminate structure of the devices, which can cause corrosion or malfunction of the devices.

In some embodiments, the methods can include identifying layers that can be susceptible to impurity penetration, such as an adhesive layer that can be degraded or deteriorated due to moisture diffusion or penetration, and then encapsulating the layers to enhance the barrier characteristics of the singulated devices against impurity diffusion or penetration, such as against fluid penetration. For example, in the case of the RFID devices fabricated on a substrate through an adhesive layer, the moisture diffusion characteristics of the adhesive layer can be much higher than that of the substrate and of the encapsulating layer. Thus the adhesive layer can be encapsulated, e.g., blocking potential moisture diffusion from the exposed side, e.g., the side that can be exposed to ambient after the laser singulation process.

For example, a portion of the adhesive layer can be removed to expose the substrate, e.g., on a diffusion path from the exposed side, and the remaining adhesive layer can be encapsulated with the encapsulating layer before the devices are singulated.

A preferred embodiment of the present invention provides the ability for an RFID device, with different elements, layers, and sections, of which has an inherent weakness within, such as an adhesive layer and delicate or susceptible components, such as an adhesive layer and substrate layer, of which diffusion of moisture or other undesirable elements may penetrate and damage the ability of the RFID, by damaging both the antenna structure (corrosion) and have negative impact on the chip electrical connection. During processing, a portion of the adhesive or RFID elements may be removed by laser cuts, or by any method necessitated by the processing, such as a laser strong enough to cut through the adhesive layer, and may also cut, completely through, partially through, or not through the substrate layer or other RFID elements. A sensor may then be presented, of which senses through any method such as laser, light, image, or any type of sensor, weak areas or areas susceptible to diffusion or penetration of undesirable elements. This data may then be used for the encapsulation procedure, pinpointed specific areas to encapsulate. An encapsulating layer may then cover the RFID, covering any side or surface of the RFID and any and all layers of the RFID, such that the adhesive layer and any layer is not exposed to the ambient. The encapsulating layer may be of any material, and may provide for preventing exposure to moisture or other impurity through diffusion or penetration. In a preferred embodiment, the cutting, may be done by laser as the substrates are singulated such as for separating the multiple RFID devices.

It is noted that in this preferred embodiment any steps previously mentioned as a method may be added, or any feature may be added in the system or apparatus. In addition the order of the steps or features may be in any order.

Figure 1B:
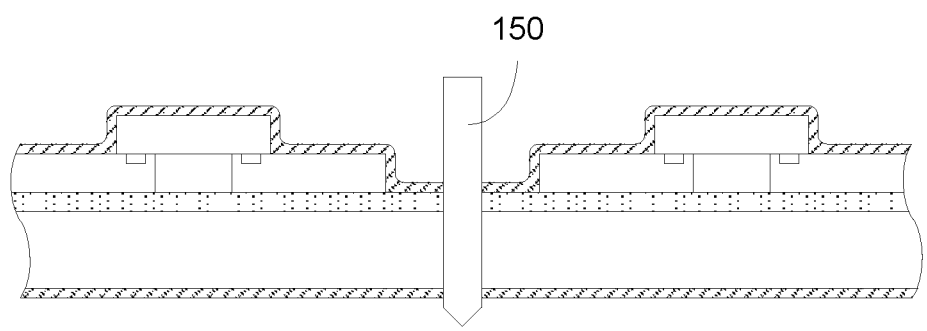
Figure 1C:
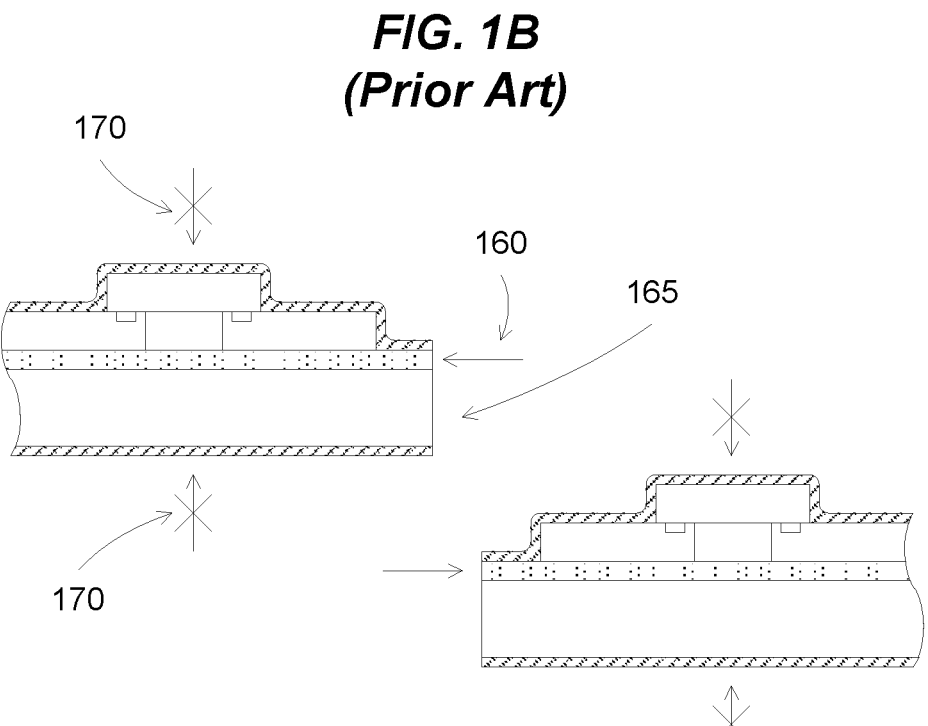

FIGS. 1A-1C illustrate a prior art roll-to-roll process for fabricating RFID transponders according to some embodiments. FIG. 1A shows a substrate 110 of a PET material supporting multiple RFID devices 130 through an adhesive layer 120. After the RFID devices are complete processed, an encapsulating layer 140, such as a moisture barrier layer, can be deposited on the whole substrate, e.g., on the top surface and on the bottom surface of the substrate 110, covering also the RFID devices. The encapsulating layer 140 can prevent moisture absorption, which can degrade the adhesion of the adhesive layer 120, and thus can delaminate the RFID devices from substrate.

In FIG. 1B, a singulation process can be performed, for example, by a laser cutting 150, which can separate the RFID devices 130 into individual devices. The laser cutting 150 can cut between the RFID devices, such as through the encapsulation layer 140, the adhesive layer 120 and the substrate 110. FIG. 1C shows two portions of the substrate after being cut. The encapsulating layer 140 can protect the devices 130 at the top and bottom surfaces, e.g., preventing moisture diffusion 170 from the top and bottom surfaces.

However, the laser cutting or other methods of singulation like punching can expose a side surface 165 of the singulated RFID device. And through the exposed surface 165, moisture can diffuse 160 to the adhesive layer 120, degrading the adhesion of the adhesive layer, and can potentially corrode and damage the RFID device 130 on the substrate 110. Moreover, through the exposed surface 165, moisture can directly ingress or infiltrate the laminate structure, thus exerting a detrimental effect to or causing a malfunction of the electronic components.

Thus, FIGS. 1A-1C show the Prior Art is lacking and that there is a need for improved RFID transponder processing, of which the Present invention uniquely and innovatively cures.

Figure 2A:
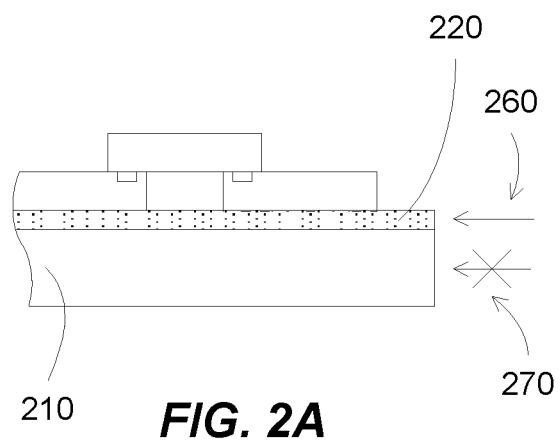
FIGS. 2A-2D illustrate side cross-section views of a process with improved diffusion barrier characteristics according to some embodiments.

FIGS. 2A-2D illustrate a process with improved diffusion barrier characteristics according to some embodiments. FIG. 2A shows an identification of the diffusion property of different layers, e.g., adhesive layer 220 and substrate layer 210. There can be a high diffusion of moisture through the adhesive layer 220, while there can be zero or small moisture diffusion through the substrate layer 210, such as PET substrate layer.

Figure 2B:
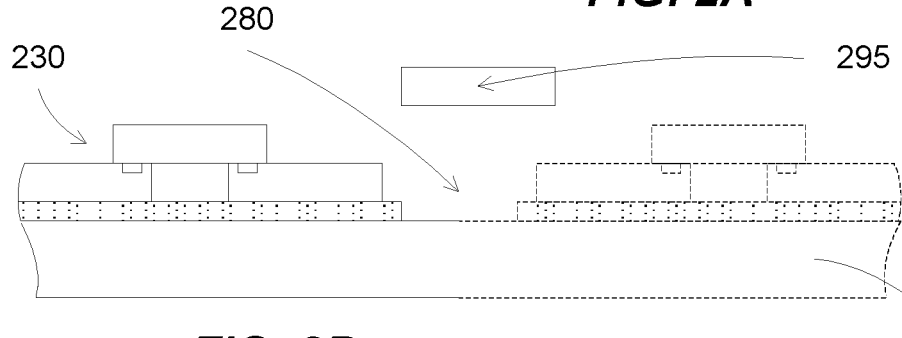

In FIG. 2B, a portion of the adhesive layer can be removed, for example, by a partial laser cut 280. The partial laser cut 280 or an adhesive removal cut 280 can be a laser cut with a power suitable for cutting through the adhesive layer, and optional a portion of the substrate layer 210, but not enough to cut through the substrate layer. Other configurations of the adhesive removal cut can be used, such as a select etching process that can remove the portion of the adhesive. In addition, optional sensor 295 may provide for a sensing ability, of which may sense areas susceptible to penetration or diffusion, of which may then be encapsulated specifically. The sensor may perform the sensing at any time, and may also provide a quality control ability for sensing the encapsulation barrier after application, ensuring the barrier is sound.

Figure 2C:
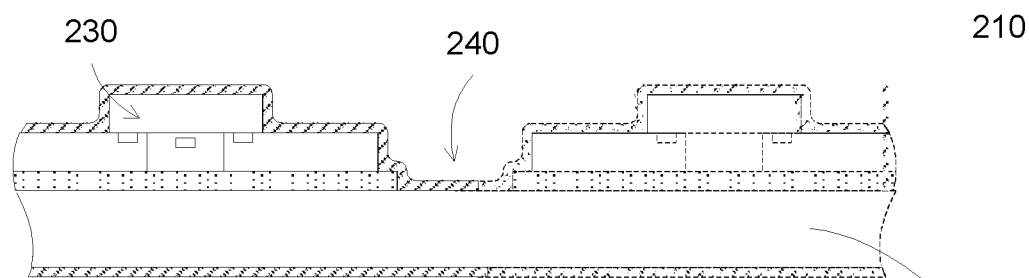

In FIG. 2C, an encapsulating layer 240 can cover the substrate 210, e.g., covering at least one of a top surface and a bottom surface of the substrate 210 whereby bottom surface is understood as the back side of the RFID transponder carrying substrate 210. The encapsulating layer 240 can also seal or encapsulate the adhesive layer 220, e.g., preventing exposing the adhesive layer 220 to moisture or other impurity diffusion or penetration. An example may be that during vacuum deposition of the encapsulating layer, or by any other process, both the front and back side, or any side, may be covered by encapsulating layer 240, but encapsulation layer 240 on one side or some of the sides, such as a bottom surface or side, may not contribute to barrier function, as long as PET or another substance forms the substrate layer, but of which the PET in the substrate, or an added barrier may provide for any other function such as moisture ingress. In generality, the barrier does not have to be the sole protection provide layer or substance in the product, but may be in addition to.

Figure 2D:
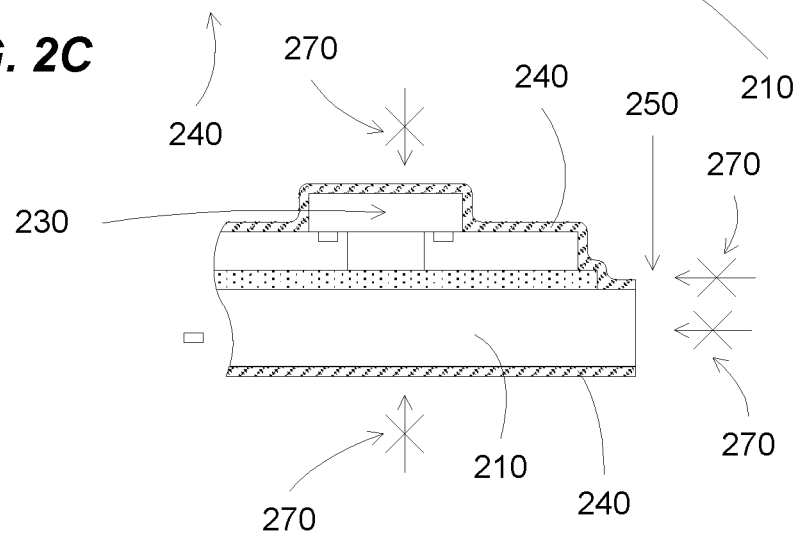

In FIG. 2D, the substrate can be singulated, e.g., separating the devices 230, for example, by a laser cut 250. The devices 230 can have a side portion exposed to the ambient after the laser cut 250. However, there can be reduced, or negligible, moisture diffusion, since the layer with high moisture diffusion property, e.g., the adhesive layer 220, is encapsulated with the encapsulating layer 240. As shown, the side as well as the top surface, and the bottom surface of the singulated devices are protected 270 from moisture diffusion. It is noted that any side, or a multiple sides of the devices may be provided with encapsulation after the laser cut.

In the present description, moisture diffusion is used as an example of impurity penetration that can degrade the devices, e.g., damaging the integrity of the devices. However, the present methods can also be effective against other forms of impurity penetration, such as fluid penetration that can cause corrosion of an antenna structure of the devices or ionic penetration that can cause device malfunctions.

In the present description, laser cut is used as an example of singulation process. However, the present methods are not limited to the examples given above, and other forms of singulation can be used, such as punching, or a combination of laser cut and punching.

In some embodiments, the present invention discloses forming a barrier at a side of an RFID component. The barrier can be used to prevent any forms of impurity penetration, such as diffusion, infiltration, or ingress of a fluid into the RFID component, for example, upon exposure to human or animal or plant organisms.

After the devices are fabricated, such as RFID components fabricated on a roll-to-roll substrate, the fabricated devices can be separated in individual devices, e.g., in a singulation process. The singulation process can expose the sides of the devices, for example, to ambient that can cause damages to the devices, such as moisture ambient that can cause delamination, corrosion or other forms of malfunctions of the devices.

In some embodiments, the present invention discloses encapsulating a portion of the side of the devices, for example, at the side portion that is susceptible to impurity penetration. The side encapsulation process can be performed from a lateral surface, for example, by forming a partial cut of the device, and sealing the sidewall of the devices exposed by the cut.

FIGS. 3A-3B illustrate flow charts for device singulation processes with improved diffusion barrier properties according to some embodiments. In FIG. 3A, operation 300 determines a potential degradation path from a singulation side to a device. Operation 310 blocks the degradation path with an encapsulation coating. Operation 320 singulates the device.

In FIG. 3B, operation 340 provides one or more layers on a substrate. Operation 350 removes a portion of the one or more layers. Operation 360 forms an encapsulation coating, wherein the encapsulation coating covers an exposed portion of the removed portion. Operation 370 singulates the substrate at the removed portion.

In some embodiments, the present invention discloses methods, and devices generated from the methods, to form devices having improved barrier properties, such as improved moisture diffusion barrier characteristics or improved barrier against any fluid penetration. The present invention recognizes that a side surface of the devices can be a potential area for impurity penetration, e.g., diffusion or ingress, due to the singulation process to form separated individual devices, since a top and bottom surface can be encapsulated, for example, by an encapsulating layer before the device singulation process.

Thus, in some embodiments, the present invention optionally identifying a low diffusion barrier layer (e.g., a layer with high moisture diffusion characteristics), then encapsulating the low diffusion barrier layer, for example, with the same top and bottom encapsulating layer, before singulating the substrate.

Figure 4A:
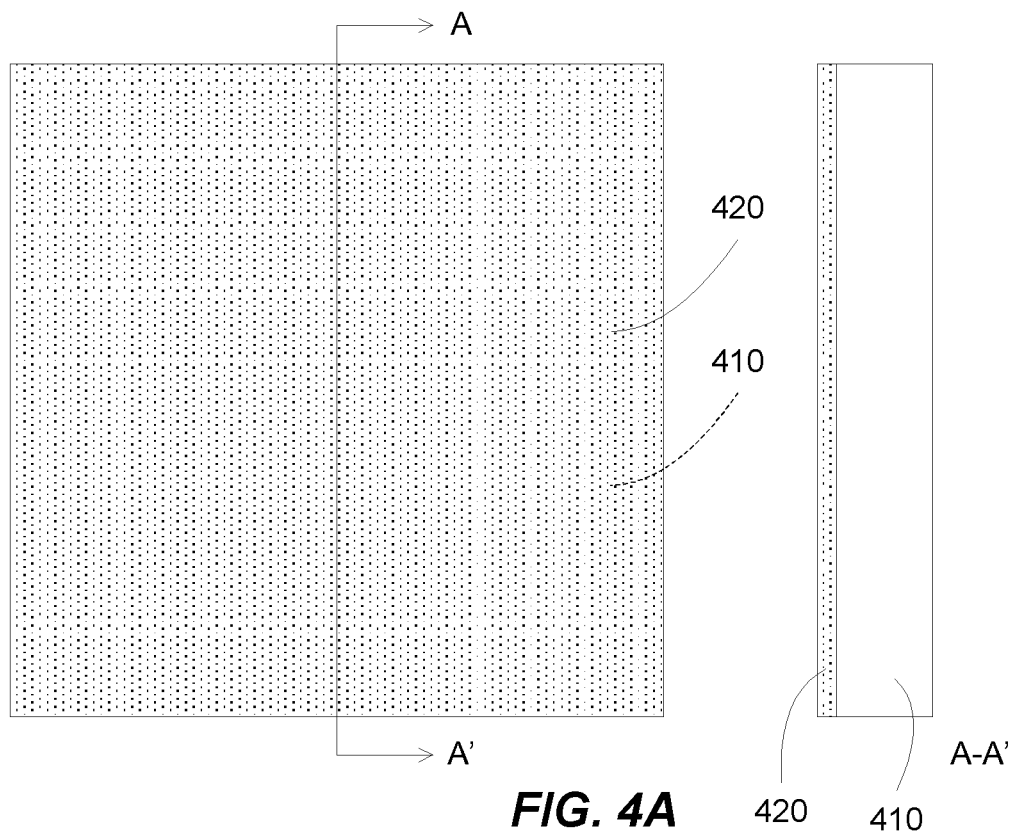
FIGS. 4A-4F illustrate component diagrams of a process for forming separated individual devices having improved barrier properties according to some embodiments.

FIGS. 4A-4F illustrate a process for forming separated individual devices having improved barrier properties according to some embodiments. In FIG. 4A, a substrate 410 can be provided, such as a PET substrate for supporting the devices and also functioning as a web transport. A layer of adhesive 420 can be disposed on the substrate 410, for example, to bond the substrate 410 to the devices that will be disposed on the substrate.

Figure 4B:
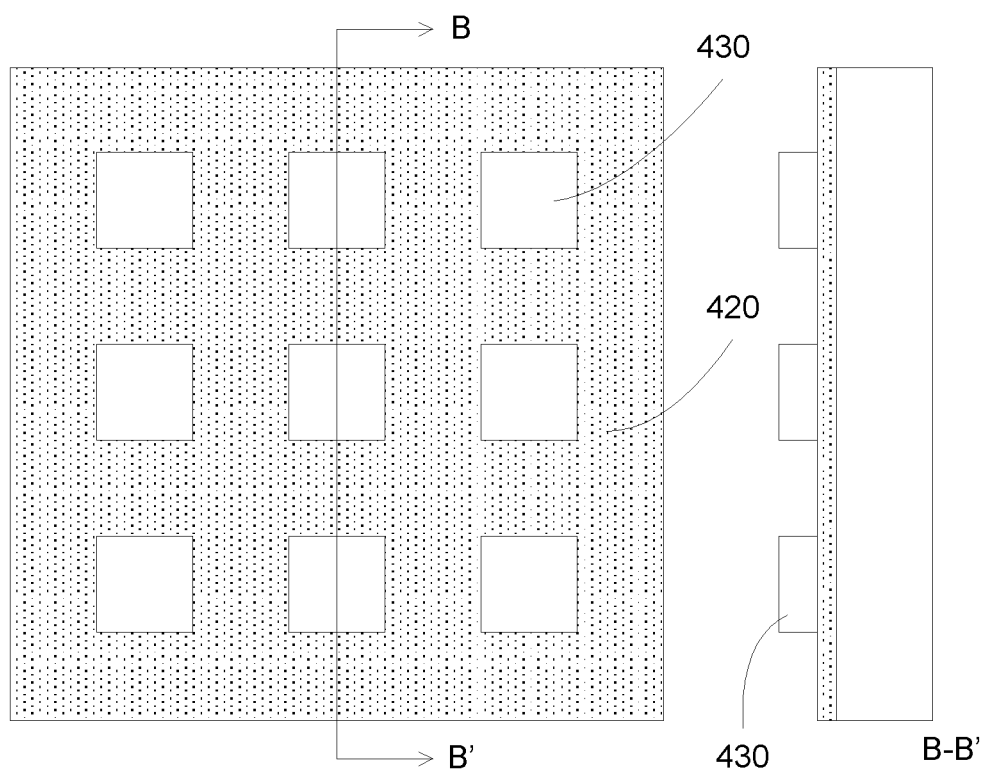

In FIG. 4B, multiple devices 430 can be provided on the adhesive layer 420. For example, the devices can be RFID transponders, including antennas coupled to RFID chips. The devices are disposed in separate locations, leaving streets in between the devices for a singulation process.

Figure 4C:
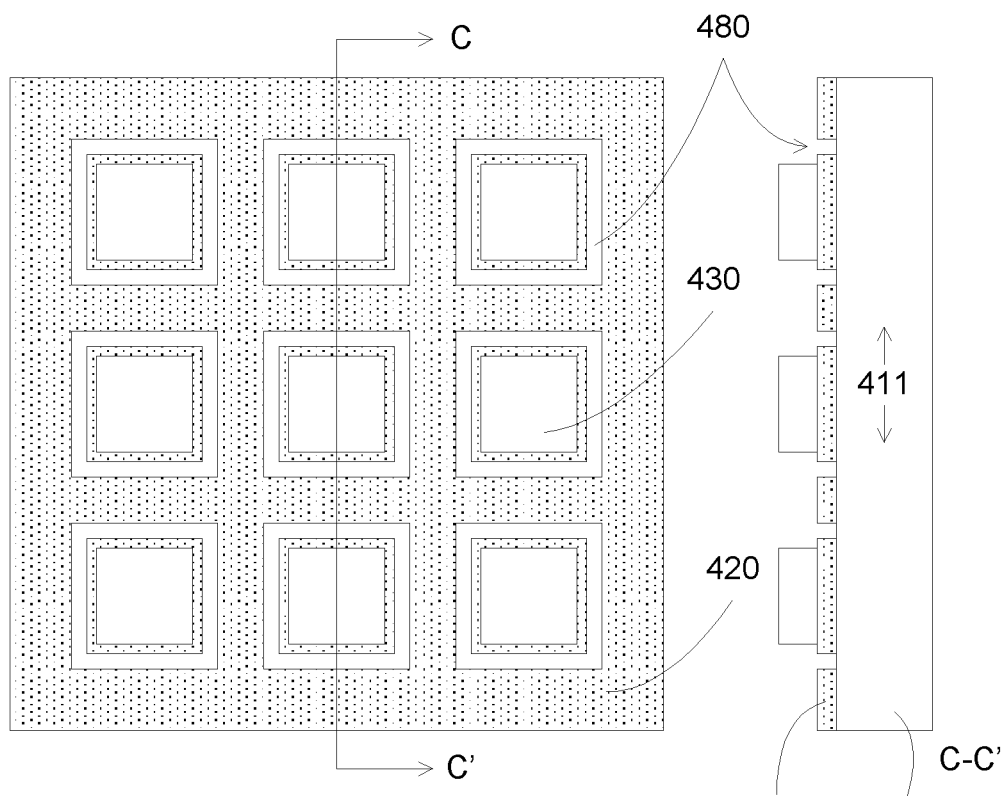

In FIG. 4C, a portion of the adhesive layer 420 can be removed. For example, the adhesive layer can be removed completely along the thickness of the adhesive layer, e.g., to form separate adhesive portions to break a diffusion or penetration path along the lateral directions 411 of the adhesive layer. The adhesive layer can be removed around the devices 430, e.g., to separate the adhesive portion under the devices from the surrounding adhesive portions to break a diffusion path along the lateral directions to reach the adhesive layer portion under the devices. The adhesive removal process can be performed by a laser cut 480, e.g., a laser cut having power controlled to remove the adhesive layer, and optionally a portion of the substrate without completely removing the substrate. Other processes can be used to remove the adhesive layer, such as a masking and stripping process.

Figure 4D:
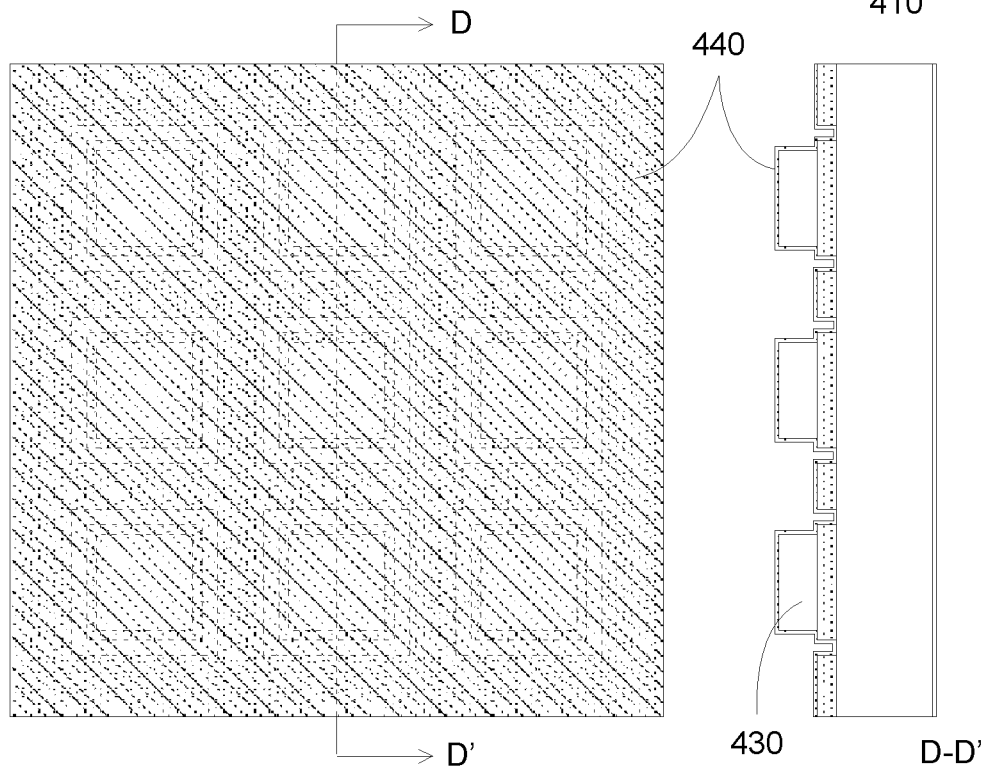

In FIG. 4D, an encapsulating layer 440 can be formed on the substrate, for example, on the top surface and on the bottom surface of the substrate, covering all exposed surface portions of the substrate. The encapsulating layer can be a conformal layer, such as a parylene layer deposited by a parylene deposition process, which can coat the side of the adhesive layer, e.g., the surface of the adhesive layer cut by the laser cutting process. The encapsulating layer can further block the diffusion path along the lateral direction of the adhesive layer. It is noted one side, such as the bottom side, does is not necessarily coated in all instances or embodiments, but may be deposited due to vacuum deposition, or may also be purposefully deposited depending on the use or need of the embodiment.

Figure 4E:
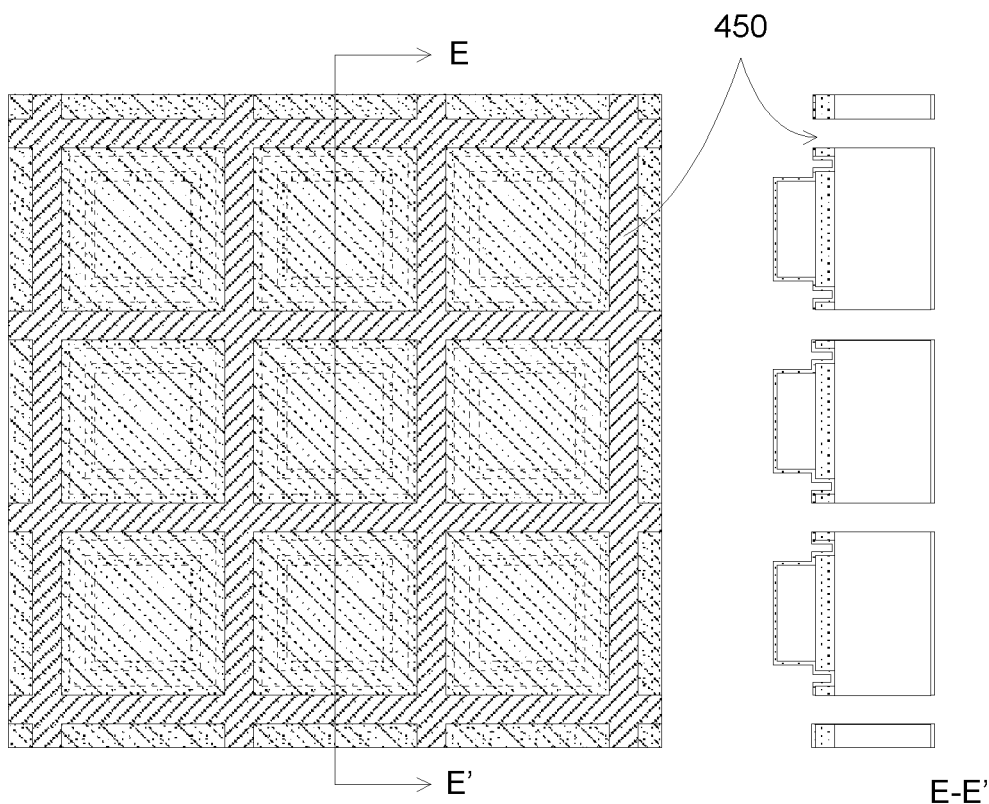
Figure 4F:
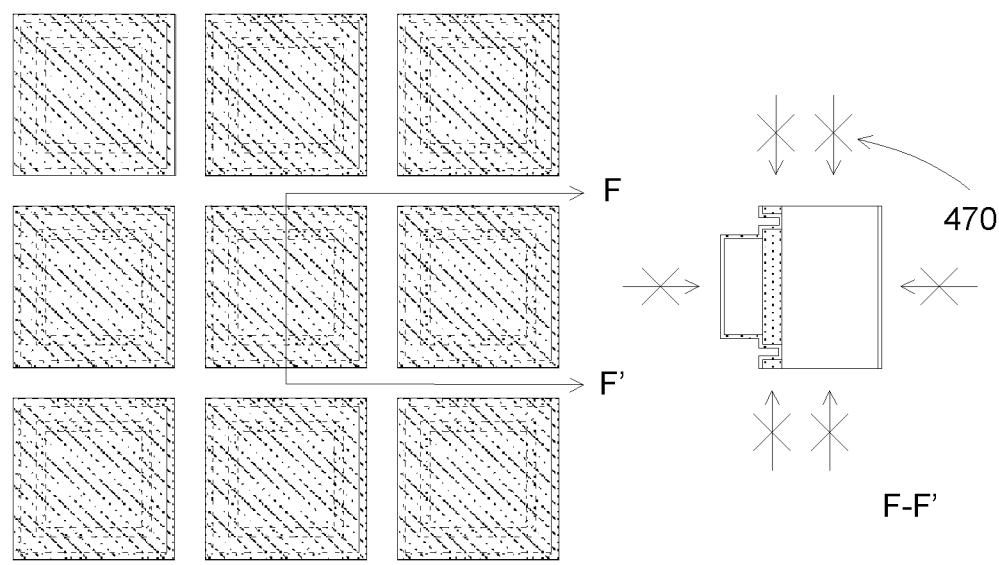

In FIG. 4E, the substrate can be singulated along the streets separating the devices to form singulated individual devices. The singulation process can be performed by a laser cut 450. FIG. 4F shows the singulated individual devices, having improved diffusion barrier since the high diffusion layer 420 is blocked 470 from a side diffusion with a cut in the diffusion layer and an encapsulating layer further blocking the diffusion path.

In the above description, removing a portion of the adhesive layer and encapsulating the exposed surface due to the removing process is used as an example of sealing the side of the devices against impurity penetration. Alternatively or additionally, other layers can be removed and encapsulated to seal the side of the devices. Also, a laser cut process is used as an example of adhesive removal and singulation process. Other forms of adhesive removal or singulation can be used, such as selective etching for adhesive removal, and punching for singulation.

Figure 5:
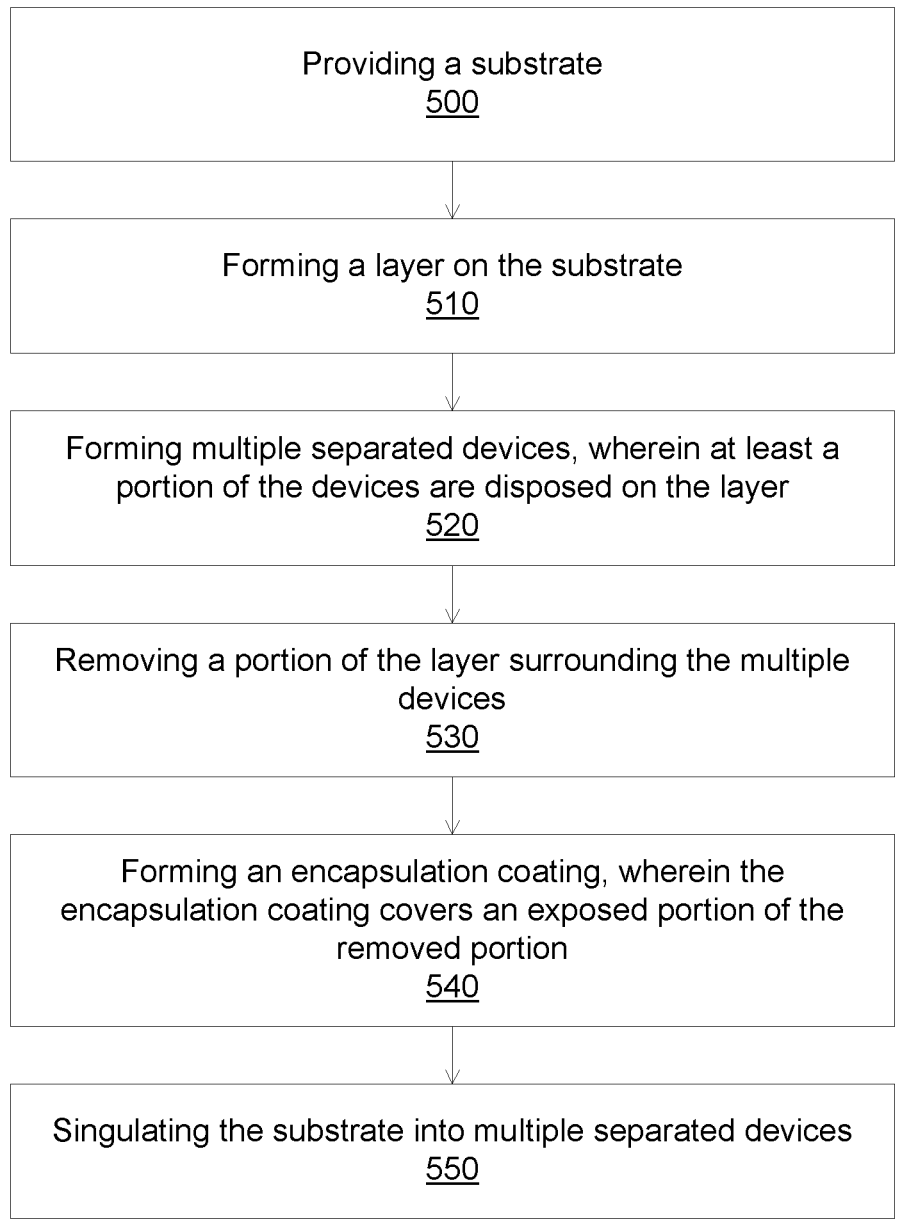
FIG. 5 illustrates a flow chart for forming devices with improved barrier according to some embodiments.

FIG. 5 illustrates a flow chart for forming devices with improved barrier according to some embodiments. Operation 500 provides a substrate. Operation 510 forms a layer on the substrate. Operation 520 forms multiple separated devices, wherein at least a portion of the devices are disposed on the layer. Operation 530 removes a portion of the layer surrounding the multiple devices. Operation 540 forms an encapsulation coating, wherein the encapsulation coating covers an exposed portion of the removed portion. Operation 550 singulates the substrate into multiple separated devices.

Other configurations can be used. For example, a laser precut can be performed, which can partially singulate the devices, thus exposing a portion of the side of the devices. The laser precut can be performed before the encapsulating process, thus the exposed device side can be encapsulated by the encapsulating layer. The laser precut can be performed before or after the adhesive removal cut.

In some embodiments, the adhesive removal cut can be a partial cut, e.g., not completely surrounding the devices. The portions that have the adhesive not removed can be protected by the laser precut process, e.g., by the encapsulating layer covering the laser precut portions.

In some embodiments, the adhesive removal cut can be a single cut or multiple cuts. The adhesive removal cut can have a narrow width to form a thin adhesive removal line, or can have a wide width to form a wide adhesive removal line. The adhesive removal cut can remove completely the adhesive layer with an optional removal of a portion of the substrate.

Figure 6A:
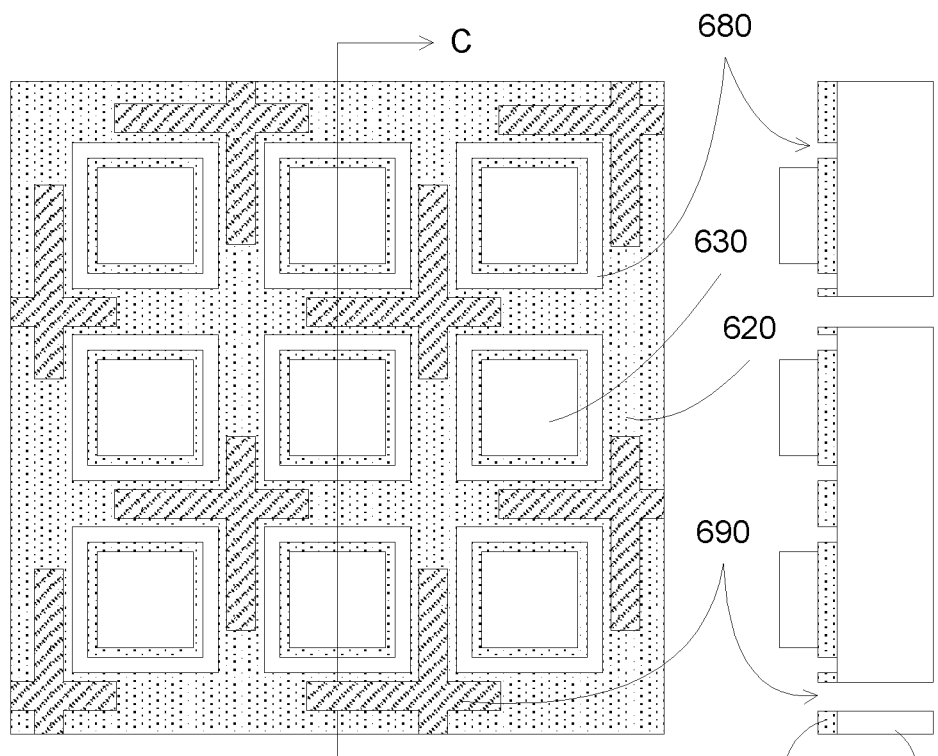
FIGS. 6A-6B illustrate component diagrams of configurations with laser precuts or partial adhesive removal cuts according to some embodiments.
Figure 6B:
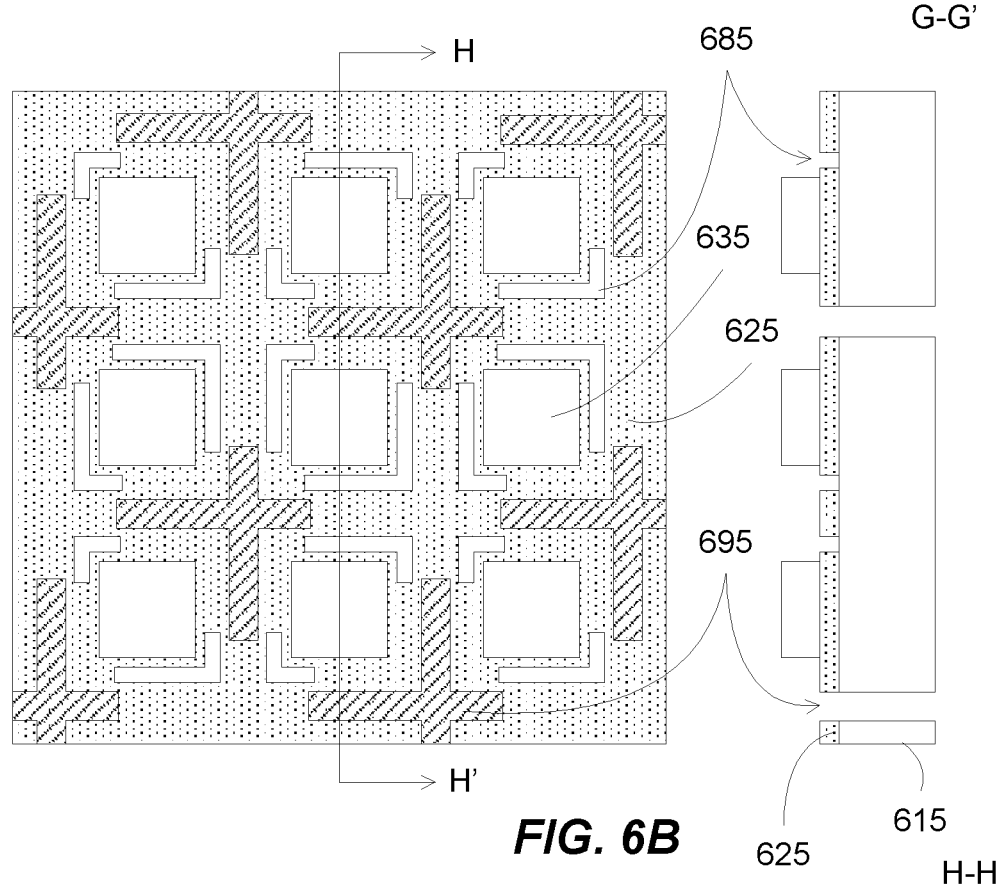

FIGS. 6A-6B illustrate configurations with laser precuts or partial adhesive removal cuts prior to encapsulation according to some embodiments. In FIG. 6A, a portion of the adhesive layer 620 can be removed. The adhesive layer can be removed around the devices 630, e.g., to separate the adhesive portion under the devices from the surrounding adhesive portions to break a diffusion or penetration path along the lateral directions to reach the adhesive layer portion under the devices. The adhesive removal process can be performed by a laser cut 680, e.g., a laser cut having power controlled to remove the adhesive layer, and optionally a portion of the substrate without completely removing the substrate. A laser precut 690 can be performed, either before or after the laser adhesive removal cut 680. The laser precut 690 can partially singulate the devices, e.g., running along the streets. After the laser precut, the devices are still attached to the substrate 610. A laser post cut can complete the singulation process, for example, by cutting to completely separate the devices.

In FIG. 6B, the adhesive layer 625 can be partially removed around the devices 635. The adhesive removal process can be performed by a laser cut 685, e.g., a laser cut having power controlled to remove the adhesive layer, and optionally a portion of the substrate without completely removing the substrate. The partially adhesive removal cut 685 can be complemented by a laser precut 695, e.g., the cut 685 and 695 can completely surround the devices, for example, to ensure that the diffusion path through the adhesive layer to the devices is a broken path. The laser precut 695 can be performed, either before or after the laser adhesive removal cut 685. The laser precut 695 can partially singulate the devices, e.g., running along the streets. After the laser precut, the devices are still attached to the substrate 615 because cut 685 does not cut the substrate 615. A laser post cut can complete the singulation process, for example, by cutting to completely separate the devices. It is noted that the cuts 685 and 695 can complement each other but in a preferred embodiment, do not overlap. For example the post cut 685 does not overlap the precut 695 or any other cuts, such that the barrier function is not lost in the overlap area or positions of the cuts, especially within the post, cut such that the barrier itself is not cut to a depth or to be rendered ineffective. It is noted that is some cases overlap will happen, and as such the cuts are made to specific depths such that the cuts do not limit the barrier function where necessary.

Figure 7:
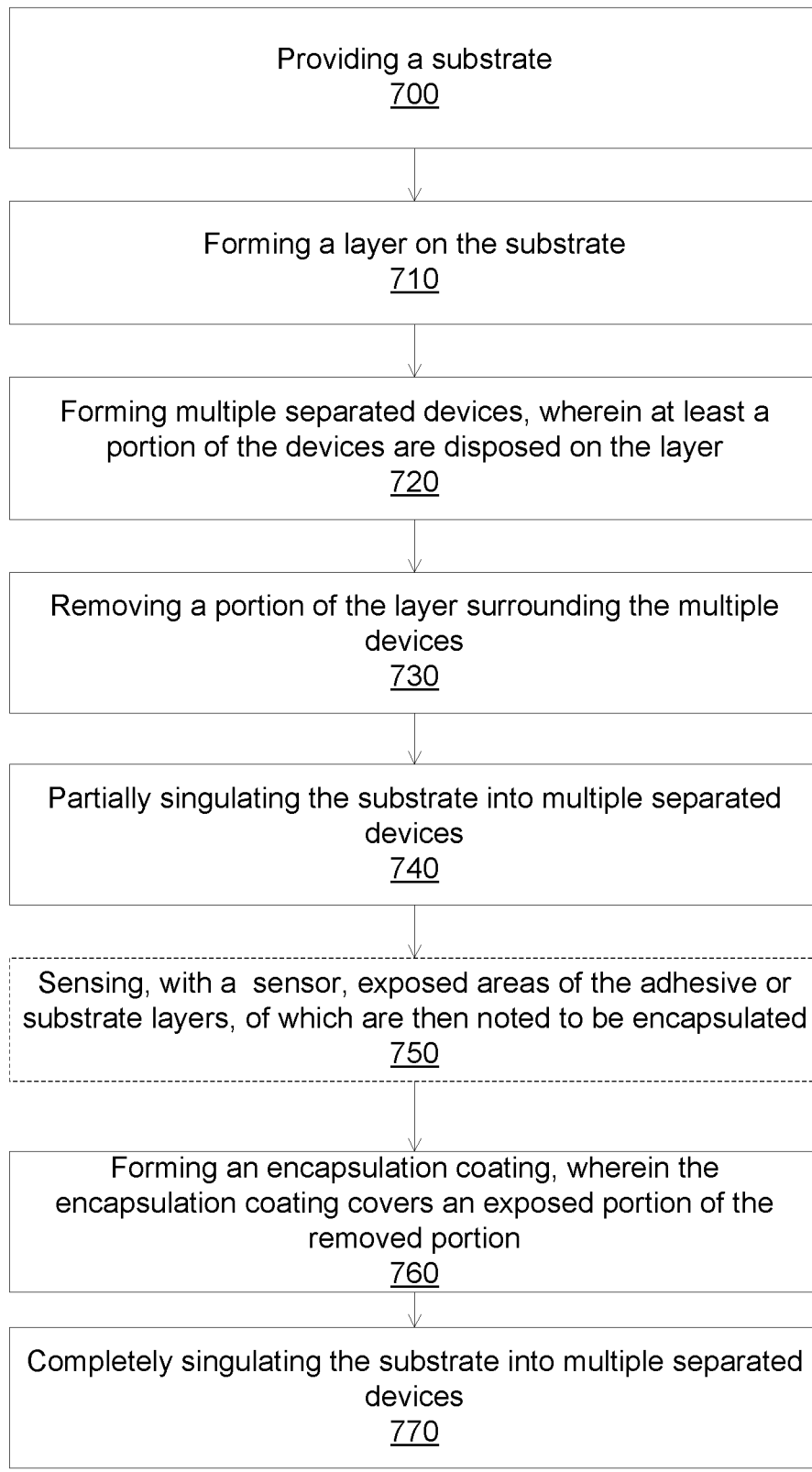
FIG. 7 illustrates a flow chart for forming devices with improved diffusion barrier according to some embodiments.

FIG. 7 illustrates a flow chart for forming devices with improved diffusion barrier according to some embodiments. Operation 700 provides a substrate. Operation 710 forms a layer on the substrate. Operation 720 forms multiple separated devices, wherein at least a portion of the devices are disposed on the layer. Operation 730 removes a portion of the layer surrounding the multiple devices. The removal portion can be partial or completely surround the devices. Operation 740 partially singulates the substrate into multiple separated devices. Optional operation 750 senses, with a sensor, exposed areas of the adhesive or substrate layers, of which are then noted to be encapsulated. Operation 760 forms an encapsulation coating, wherein the encapsulation coating covers an exposed portion of the removed portion. Operation 760 singulates the substrate into multiple separated devices.

In some embodiments, the adhesive removal cut can be a single cut or multiple cuts. The adhesive removal cut can have a narrow width to form a thin adhesive removal line, or can have a wide width to form a wide adhesive removal line. The adhesive removal cut can remove completely the adhesive layer with an optional removal of a portion of the substrate.

Figure 8A:
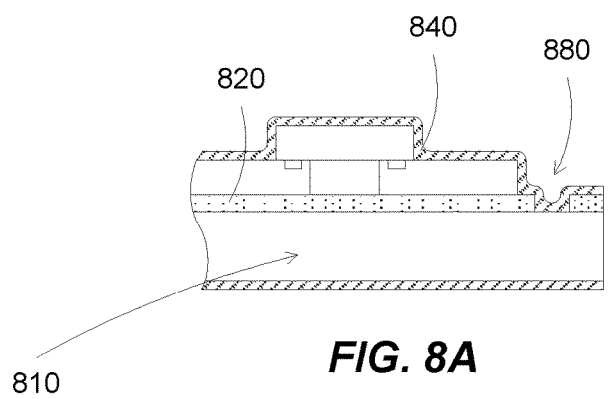
FIGS. 8A-8F illustrate side cross-section views of device configurations after encapsulation according to some embodiments.

FIGS. 8A-8F illustrate device configurations after encapsulation according to some embodiments. In FIG. 8A, an adhesive removal cut 880 can cut through an adhesive layer 820 to break an impurity penetration path from a side of the devices. There can be a single cut of the adhesive removal cut 880. The encapsulating layer 840 can seal off the break to further block the penetration path. The adhesive removal cut 880 can be wide or narrow. As shown, the adhesive removal cut 880 can be wide so that the encapsulating layer 840 can form a conformal layer throughout the cut. It is noted that a substrate is also present as substrate 810, of which the layers are bounded on.

Figure 8B:
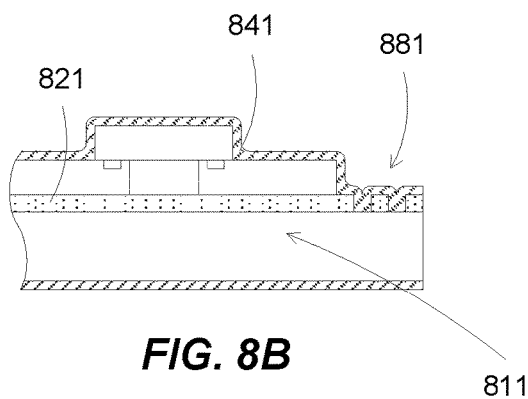

In FIG. 8B, an adhesive removal cut 881 can cut through an adhesive layer 821 to break an impurity penetration path from a side of the devices. There can be multiple cuts of the adhesive removal cut 881. The encapsulating layer 841 can seal off the break to further block the penetration path. The adhesive removal cut 881 can be wide or narrow. As shown, the adhesive removal cut 881 can be narrow so that the encapsulating layer 841 can fill the cuts. It is noted that a substrate is also present as substrate 811, of which the layers are bounded on.

Figure 8C:
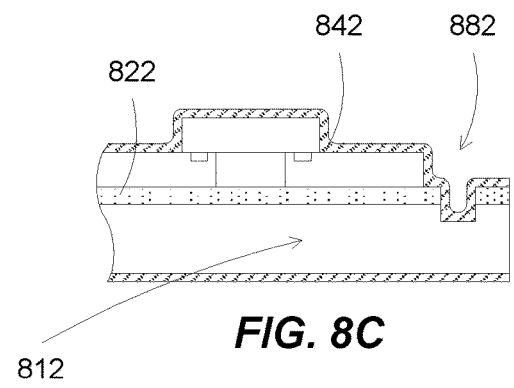

In FIG. 8C, an adhesive removal cut 882 can cut through an adhesive layer 822 and a portion of the substrate 812 to break an impurity penetration path from a side of the devices. There can be a single cut of the adhesive removal cut 882. The encapsulating layer 842 can seal off the cut to further block the penetration path. The adhesive removal cut 882 can be wide or narrow. As shown, the adhesive removal cut 882 can be wide so that the encapsulating layer 842 can form a conformal layer throughout the cut. It is also noted that the substrate layer as marked in FIG. 8C as substrate 812 is also correspondingly a substrate in the rest of FIGS. 8A-8F.

Figure 8D:
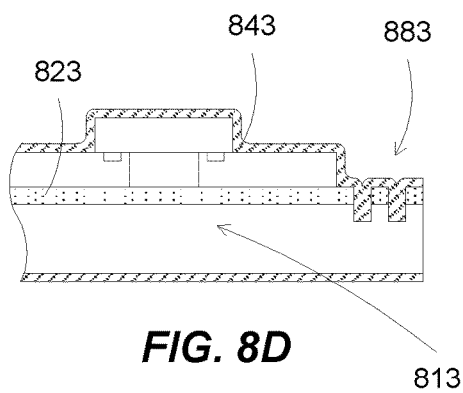

In FIG. 8D, an adhesive removal cut 883 can cut through an adhesive layer 823 and a portion of the substrate 813 to break an impurity penetration path from a side of the devices. There can be multiple cuts of the adhesive removal cut 883. The encapsulating layer 843 can seal off the cut to further block the penetration path. The adhesive removal cut 883 can be wide or narrow. As shown, the adhesive removal cut 883 can be narrow so that the encapsulating layer 843 can fill the cuts.

Figure 8E:
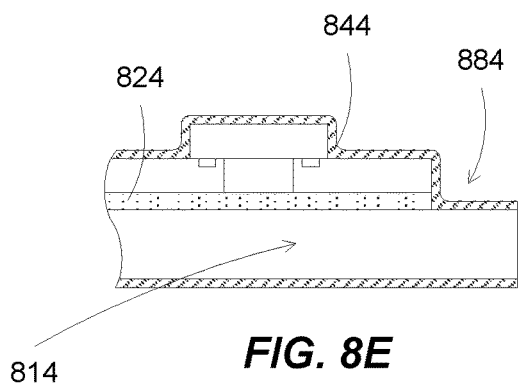

In FIG. 8E, an adhesive removal cut 884 can cut through an adhesive layer 824 to break an impurity penetration path from a side of the devices. As shown, the adhesive removal cut 884 can be close to the devices and can be extended to the edge of the laser cut portion. The encapsulating layer 844 can further seal off the break to block the penetration path. It is noted that a substrate is also present as substrate 814, of which the layers are bounded on.

Figure 8F:
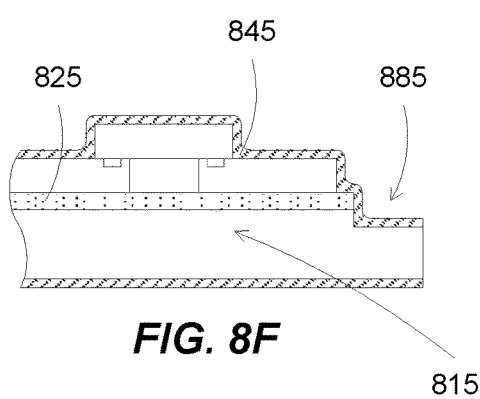

In FIG. 8F, an adhesive removal cut 885 can cut through an adhesive layer 825 and a portion of the substrate 815 to break an impurity penetration path from a side of the devices. As shown, the adhesive removal cut 885 can be extended to the edge of the laser cut portion. The encapsulating layer 845 can seal off the cut to further block the penetration path.

In some embodiments, the adhesive removal cut can be similar or can be different at different portions of the cut surrounding the devices. For example, single cut, multiple cuts, cutting to the edge of the devices, cutting to the edge of the laser cut, cutting stopping at the substrate, or cutting through a portion of the substrate can be used.

Figures 9A, 9C:
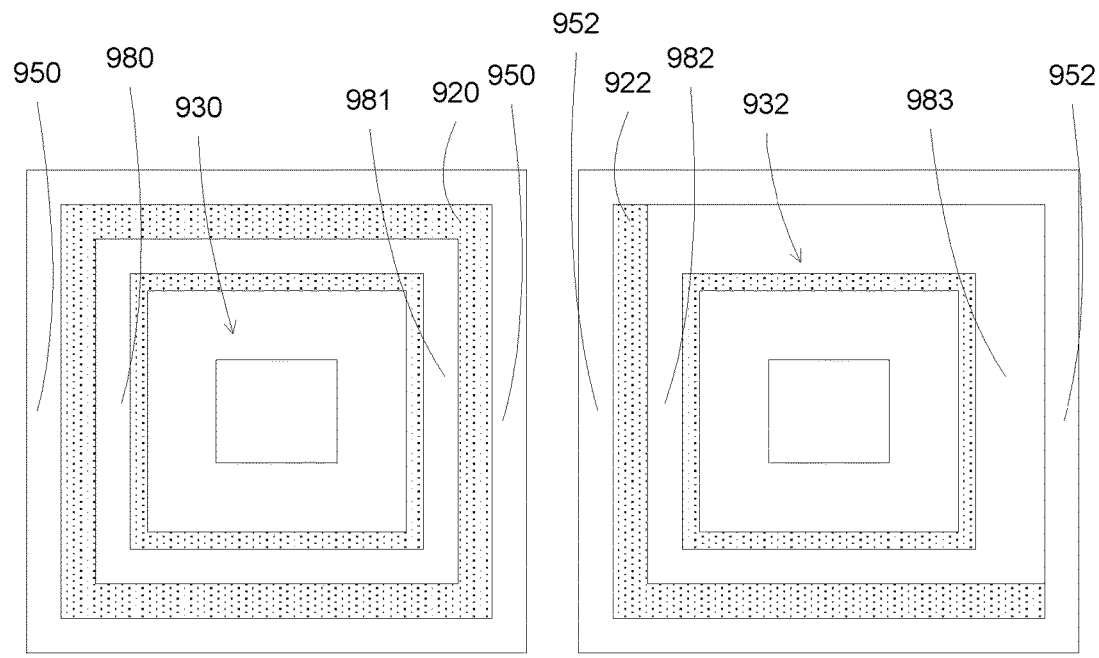
FIGS. 9A-9D illustrate top down and cross-section views of device configurations with different adhesive removal cuts according to some embodiments.
Figures 9B, 9D:
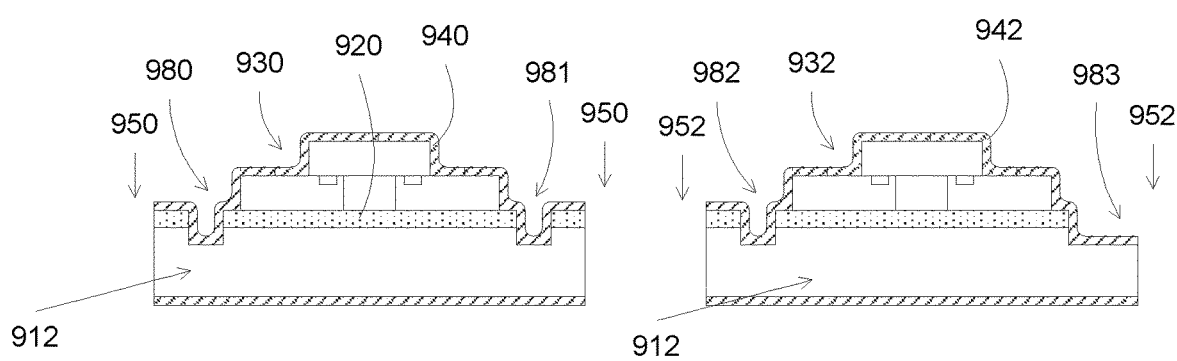

FIGS. 9A-9D illustrate device configurations with different adhesive removal cuts according to some embodiments. In FIGS. 9A-9B, device 930 can have similar adhesive removal cuts around the device. FIG. 9A shows a top view of a device configuration before encapsulation. Device 930 can have similar adhesive removal cuts around the device. For example, the adhesive removal cut 980 at the left side of the device 930 can be the same as the adhesive removal cut 981 at the right side of the device 930, meaning cutting through the adhesive layer 920 and a portion of the substrate, of which the substrate is not viewable from the top view of 9A and 9C, but of which in FIGS. 9B and 9D is respectively labeled, as from the top view the substrate is respectively below the viewable layer and encapsulation layer. A laser cut 950 can be around the device 930 and the adhesive removal cuts 980 and 981.

FIG. 9B shows a cross section of a device configuration after encapsulation. After the adhesive removal cut 980 and 981, an encapsulation layer 940 can be used to encapsulate the devices, e.g., sealing the top surface, the bottom surface, and the exposed surface after the adhesive removal cut 980 and 981.

In FIGS. 9C-9D, device 932 can have different adhesive removal cuts around the device. FIG. 9C shows a top view of a device configuration before encapsulation. The adhesive removal cut 982 at the left side of the device 932 can be a cut through the adhesive layer 922 and a portion of the substrate 912. The adhesive removal cut 983 at the right side of the device 932 can be a cut through the adhesive layer 922 and a portion of the substrate 912, together with an extension to the edge of the laser cut 952. The laser cut 952 can be around the device 932 and the adhesive removal cuts 982 and 983.

FIG. 9D shows a cross section of a device configuration after encapsulation. After the adhesive removal cut 982 and 983, an encapsulation layer 942 can be used to encapsulate the devices, e.g., sealing the top surface, the bottom surface, and the exposed surface after the adhesive removal cut 982 and 983. It is noted that the substrate 912 is present.

In some embodiments, a laser precut can be performed, e.g., a partially singulating cut can be made before the encapsulating coating process. The devices are still attached to the substrate after the laser precut, and a laser post cut can be needed to completely singulate the devices from the substrate. With the laser precut, the adhesive removal cut can be partial or can be complete.

Figure 10A:
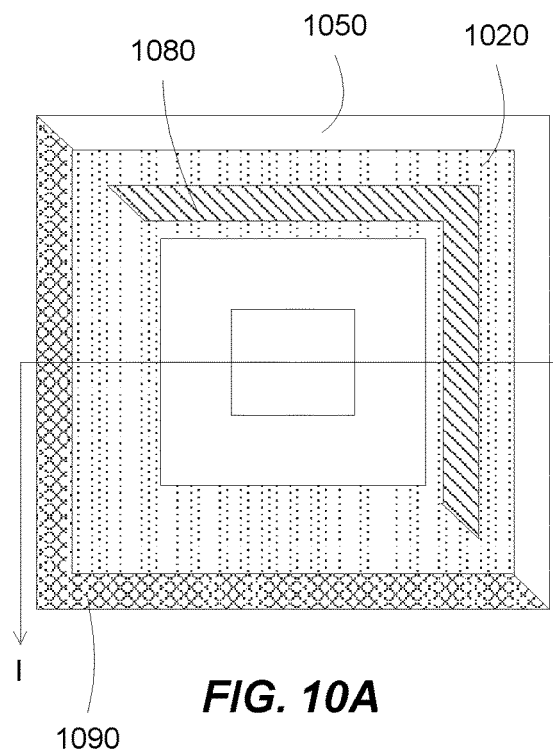
FIGS. 10A-10D illustrate top down and cross-section views of device configurations having different laser precuts according to some embodiments.
Figure 10C:
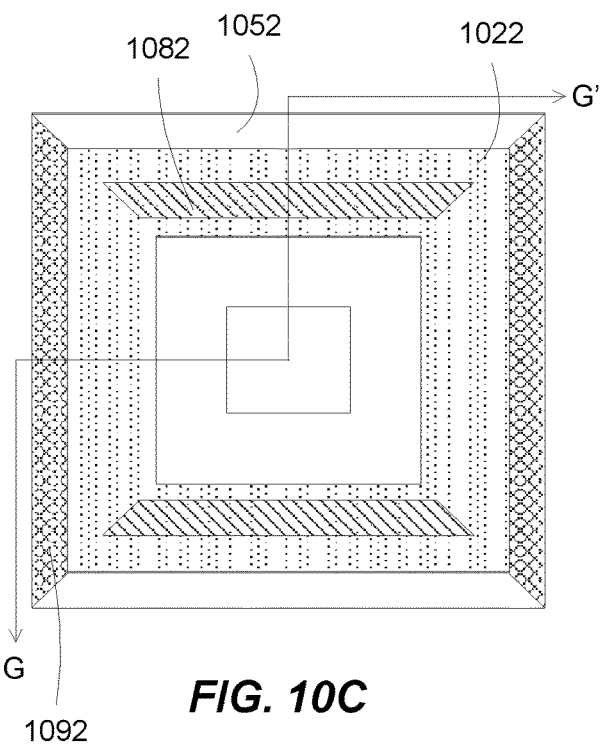
Figure 10B:
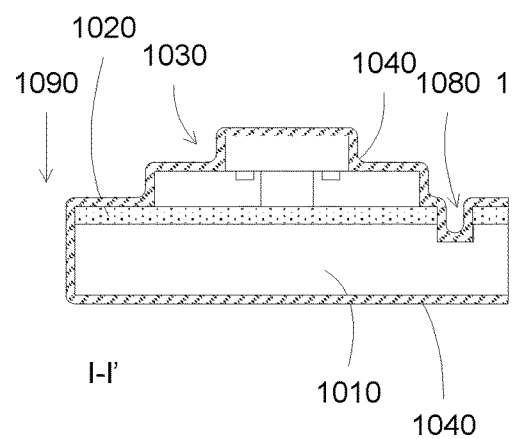

FIGS. 10A-10D illustrate device configurations having different laser precuts according to some embodiments. FIG. 10A shows a top view of a device configuration before encapsulation. In FIGS. 10A-10B, a laser precut 1090 can be performed at a left side and a bottom side of the device 1030. The adhesive removal cut 1080 can be at a top side and a right side of the device. The adhesive removal cut 1080 can also be at other sides. After the encapsulating layer 1040, a laser post cut 1050 at a top side and a right side can be used to singulate the devices. FIG. 10B shows a cross section of a device configuration after encapsulation. After the precut 1090 and the adhesive removal cut 1080, an encapsulation layer 1040 can be used to encapsulate the devices, e.g., sealing the top surface, the bottom surface, and the exposed surface after the precut 1090 and the adhesive removal cut 1080.

Figure 10D:
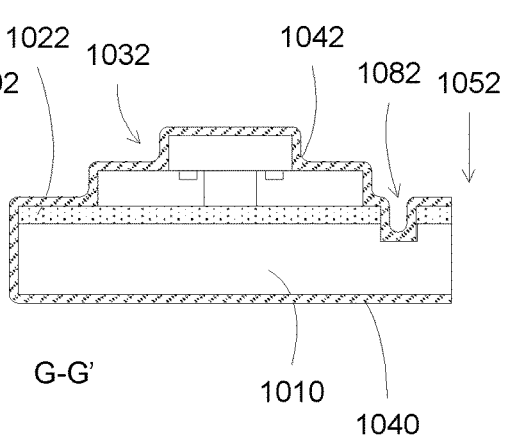

FIG. 10C shows a top view of another device configuration before encapsulation. In FIGS. 10C-10D, a laser precut 1092 can be performed at a left side and a right side of the device 1032. The adhesive removal cut 1082 can be at a top side and a bottom side of the device. The adhesive removal cut 1082 can also be at other sides. After the encapsulating layer 1042, a laser post cut 1052 at the top and bottom sides can be used to singulate the devices. FIG. 10D shows a cross section of a device configuration after encapsulation. After the precut 1092 and the adhesive removal cut 1082, an encapsulation layer 1042 can be used to encapsulate the devices, e.g., sealing the top surface, the bottom surface, and the exposed surface after the precut 1092 and the adhesive removal cut 1082.

In some embodiments, the present invention discloses RFID devices and methods of forming the RFID devices with improved reliability such as enhanced moisture diffusion barrier, which can reduce the delamination of the antennas and the RFID chips and devices.

Figure 11A:
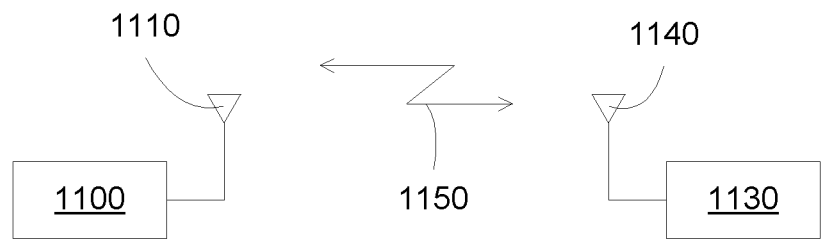
FIGS. 11A-11B illustrate component views of basic components of an RFID system according to some embodiments.
Figure 11B:
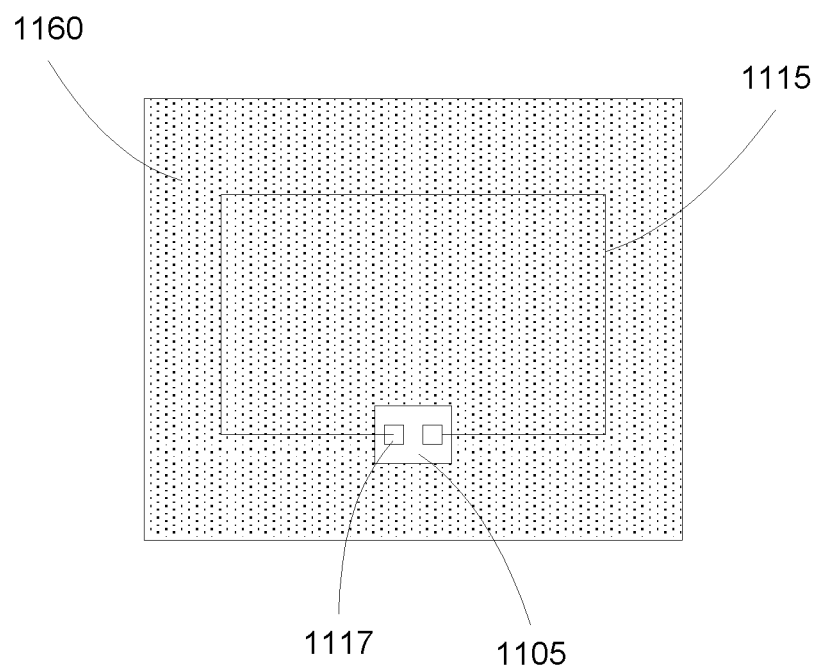

FIGS. 11A-11B illustrate basic components of an RFID system according to some embodiments. In FIG. 11A, an RFID transponder (or tag) 1100 can communicate 1150 with an RFID reader 1130 through antenna 1110 and 1140. The RFID transponder 1100 can include an integrated circuit or chip, for example, to store and process information, modulate and demodulate radio frequency (RF) signals 1150 through the antenna 1110. The RFID reader 1130 can transmit a modulated RF signal 1150 through the antenna 1140 to the transponder 1100. In a passive RFID system, the antenna 1110 of the RFID transponder 1100 receives the RF signal and form electric and magnetic fields to draw power for the integrated circuit. The integrated circuit in the RFID transponder 1100 can modulate an RF signal 1150 back to the RFID reader 1130, providing information stored in the RFID transponder 1100.

In FIG. 11B, an RFID transponder can include an RFID chip 1105 coupled to an antenna 1115, for example, through bond pads 1117. The antenna 1115 can include an antenna loop. Other antenna configurations can be used. The RFID transponder can be placed on a substrate 1160, and can communicate with an RFID reader through an antenna of the RFID reader.

The RFID transponders can be fabricated using a roll-to-roll process, in which the standard web materials can have a thin aluminum foil (about 9 µm thickness) adhered to 25 µm-50 µm PET substrate via a thin layer of adhesive (thickness 2 µm-5 µm). The aluminum foil can be selectively etched, e.g., etching the aluminum but not the polymer adhesive or the PET material, to form the antenna structures. An encapsulating layer, such as a parylene or silicone layer, can be deposited by standard techniques. The RFID transponders can be singulated from the PET substrate via laser cut or punching or a combination thereof.

Figure 12A:
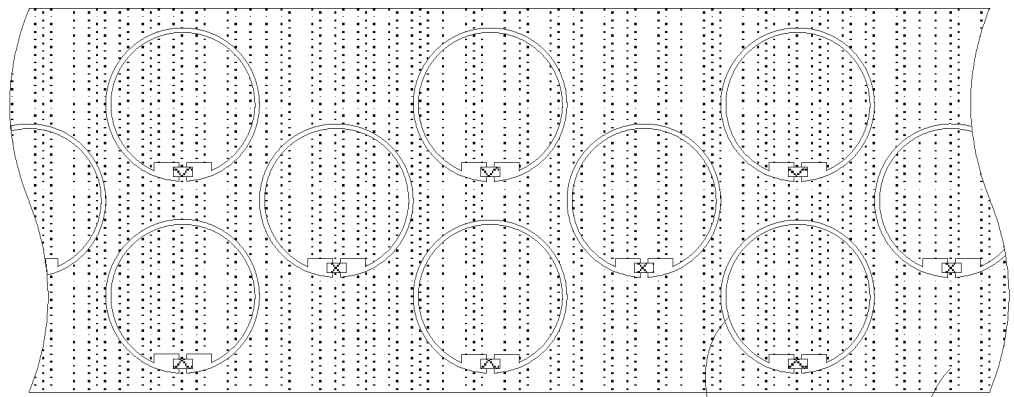
FIGS. 12A-12C illustrate top down views of a roll-to-roll fabrication process for forming RFID transponders according to some embodiments.
Figure 12B:
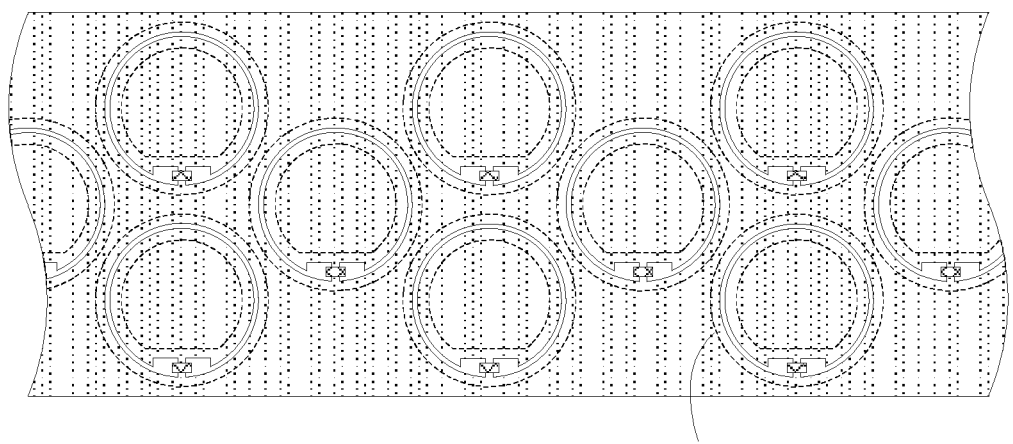
Figure 12C:
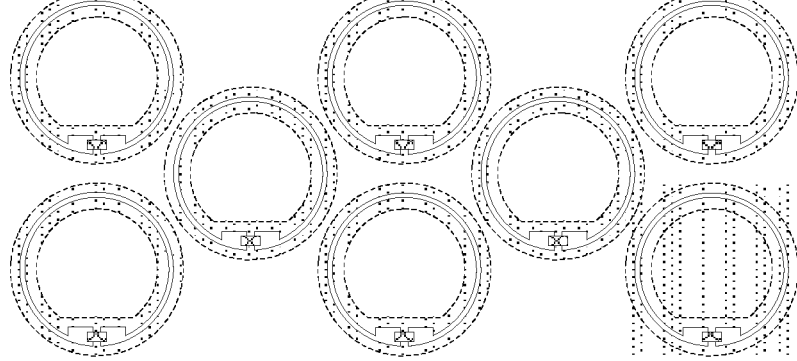

FIGS. 12A-12C illustrate a roll-to-roll fabrication process for forming RFID transponders according to some embodiments. A substrate 1210, such as a PET substrate, can have multiple RFID transponders 1230 adhered thereon, for example, on an adhesive layer. A laser cut 1250 can be performed, to singulate the RFID transponders 1230 on the substrate 1210 into individual separated RFID transponders 1235.

In some embodiments, the present invention discloses methods and arrangements to generate a barrier on flexible substrates with conductive layer and electronic devices using an encapsulated layer such as parylene. The methods can include arranging or creating electrical functional elements on a flexible adhesive coated base substrate with conductive tracks. The substrate can carry a number of functional elements. The methods can also include precutting the substrate into future single functional elements in which the single functional elements are partly connected with the base substrate that maintains the web. The methods can also include partly removing the adhesive off the base substrate on the web bridges. The methods can also include coating the whole arrangement, e.g., the substrate and the devices, with an encapsulating layer such as parylene. The methods can include singulating the functional elements by a final cut at the web forming sites.

In some embodiments, the present invention discloses methods to remove a thin adhesive layer from the surface of a PET (Polyethylene terephthalate) substrate, for example, via laser cutting methods prior to the parylene deposition, thereby substantially improving the barrier properties of the PET/parylene combination.

In some embodiments, the thin adhesive layer can be removed from selective areas via a laser methodology. The area in which the adhesive is removed can be selected to ensure that the barrier is improved, for example, with respect to potential moisture ingress areas which can result from the singulation processes after the encapsulating process. In some embodiments, the adhesive layer can be removed at areas along a post cut line, since the post cut line would expose the adhesive layer if the adhesive layer has not been removed.

In some embodiments, the present invention discloses methods to improve reliability of fabricated devices, including RFID devices, by blocking impurity penetration paths from a singulated side (e.g., a side of the devices formed after the singulation process). For example, the encapsulating layer, such as the parylene layer, has high moisture barrier, so it would not be the diffusion route for the moisture. The substrate layer, such as the PET layer, is also a polymer with excellent moisture barrier properties, so it would also not be the diffusion route for the moisture. The thin adhesive layer is identified as a potential moisture diffusion path, since it can be porous and can already contain a certain percentage of moisture. Further, the thin adhesive layer can be affected by the processing steps of forming the devices, such as retaining ions from the aluminum etch solution. Thus the polymer adhesive layer can be the route via which moisture or ionic fluids can diffuse through the exposed area to reach the chips or aluminum structures to cause corrosion and improper electrical function or malfunction.

In some embodiments, the present invention discloses removing a portion of the adhesive layer at a singulated side of the devices and/or encapsulating the exposed portion of the remaining adhesive layer, for example, to improve the reliability of the devices by blocking the potential impurity penetration path, such as moisture diffusion path.

Figure 13A:
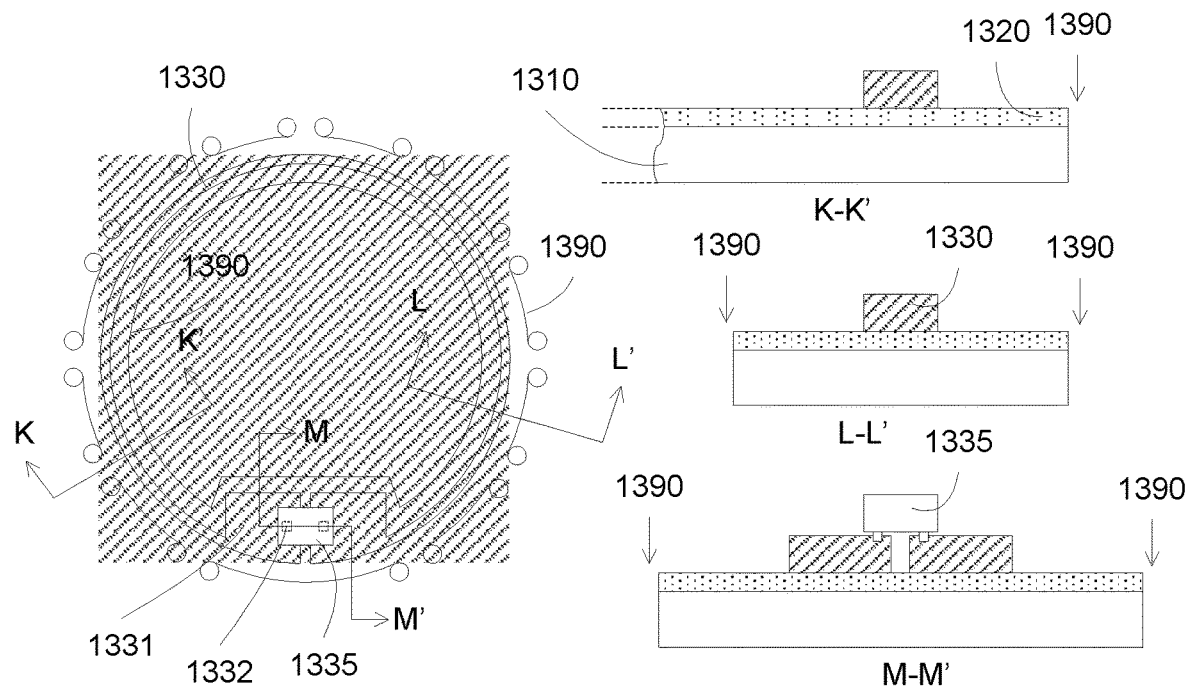
FIGS. 13A-13D illustrate top down views and side cross section views of a process for forming RFID devices having improved reliability according to some embodiments.

FIGS. 13A-13D illustrate a process for forming RFID devices having improved reliability according to some embodiments. In FIG. 13A, a substrate 1310, such as a PET material, can also function as a web material for the roll-to-roll fabrication of RFID devices. Multiple RFID devices 1330 can be fabricated or attached on the substrate 1310. In some embodiments, the substrate 1310 can include a layer of polymer adhesive 1320, on which adhered a thin aluminum layer. The thin aluminum layer can be patterned to form an antenna structure for the RFID devices 1330. The antenna structure is shown as a ring, but other configurations can be used, such as a line, or a rectangular shape. The antenna structure can include two large pads 1331 for bonding to bond pads 1332 of an RFID chip 1335.

A precut process 1390 can be performed to partially singulate the devices. In a precut process, the substrate 1310 can be partially cut prior to the parylene deposition process. The partial cut can cut completely the thickness of the substrate, but the partial cut does not completely enclose the devices, thus the devices are still attached to the substrate. The precut can yield a better sealing of the singulated material, for example, from moisture ingress, since with the precut, parylene can deposit overall and between the cuts.

Since the precut only partially singulate the devices, the devices are still attached to the web substrate. The still-attached part will also need to be cut, for example, in a post cut process, which can be performed after the parylene encapsulating process. The post cut process can singulate the devices, e.g., the post cut can cut the still-attached substrate area to release the part from the web.

Since the post cut is performed after the encapsulating process, there can be open areas in the parylene sealing, which can allow moisture ingress, for example, through the exposed adhesive between the parylene layer and PET substrate layer.

In some embodiments, the present invention discloses an additional step of removing the adhesive layer in order to limit or eliminate the exposure of adhesive after the post cut process. An adhesive removal cut can be performed, which can remove adhesive in a vicinity of the post cut, essentially blocking the path of impurity penetration, which includes moisture diffusion, from the post cut to the devices.

In some embodiments, the cuts, e.g., the precut, the post cut, and the adhesive removal cut, can be performed by a laser cutting process. The cutting process can take place via a series of laser scan over the same region or line. In this way material is sequentially removed by the laser until it cuts through the entire thickness of the material to singulate the part. Using laser cut, the depth of the cut can be controlled, for example, by controlling the number of scan through a same region or line, or by controlling the power of the laser. The precut and post cut can cut through the substrate, while the adhesive removal cut can cut only through the adhesive layer, with optionally cutting through a portion of the substrate.

The cutting width of the precut, post cut and adhesive removal cut can be controlled by the laser cutting process, for example, by running laser scans next to each other to increase the width of the laser cut. Alternatively, defocusing the laser beam can also enlarge the cutting width.

In some embodiments, the present invention discloses preventing impurity penetration, which includes moisture ingress, to the devices. This can be done by using a laser to remove the thin layer of adhesive from the PET substrate surface. For example, a small number of laser scans, probably at a lower power, to remove the adhesive material from the surface of the PET substrate. The PET substrate surface can be slightly damaged or roughened by the laser removal process. The laser processing can be controlled so that there is no additional cutting through the PET substrate. This removal process takes place between the metal lines and the chip area of the transponder and the edge of the part, which is cut by the laser to singulate the part from the web material. By removing the adhesive, there can then be direct contact between the parylene layer and the PET layer generated during the parylene deposition process. This has the advantage that there is no adhesive between PET and parylene, and this point will be a barrier to the moisture ingress.

Figure 13B:
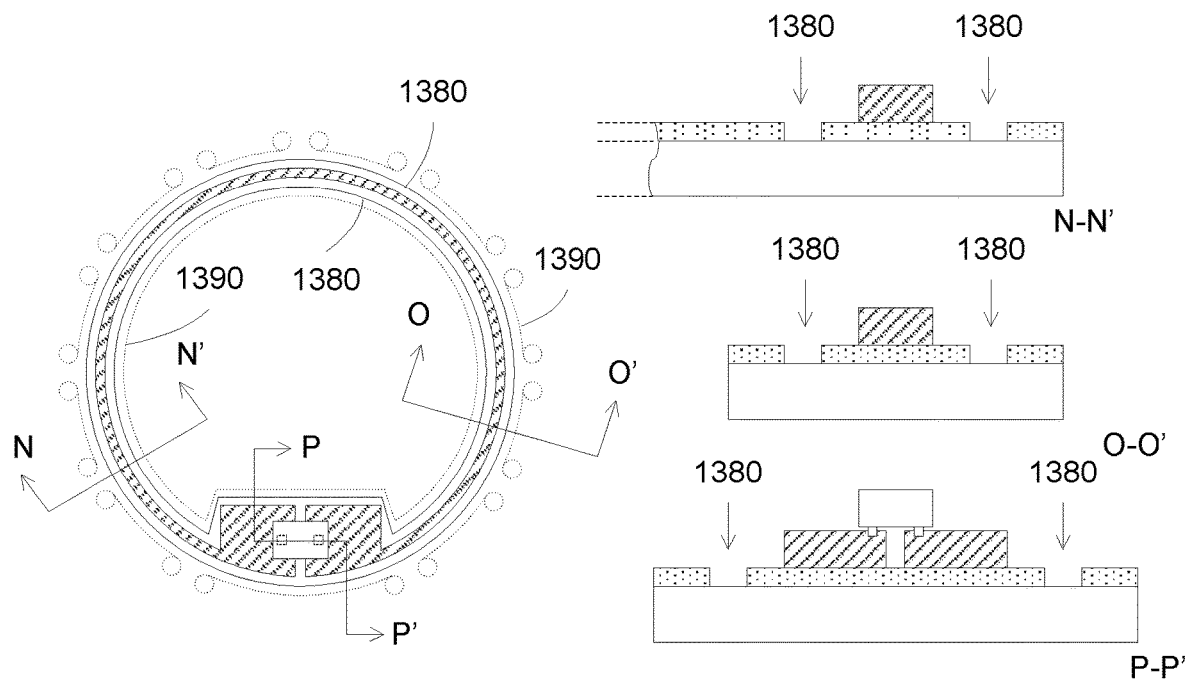

In FIG. 13B, an adhesive removal cut 1380 can be performed to remove adhesive at areas that can provide an impurity penetration path to the devices. The laser removal area can be between the precut and any metal structures or chip bond structures of the devices. For example, the adhesive removal cut 1380 can be performed in an outer periphery and an inner periphery of the devices.

In some embodiments, the precut and the adhesive removal cut can be performed in any order. For example, as shown, the precut is performed before the adhesive removal cut. Alternatively, the adhesive removal cut can be performed before the precut.

As shown, the adhesive removal cut 1380 can provide a complete blocking of the impurity penetration path to the devices, e.g., even without the precut 1390. Other configurations can be used, such as an adhesive removal cut that complements the precut, e.g., the adhesive removal cut and the precut together can form a complete blocking of the impurity penetration path to the devices.

Figure 13C:
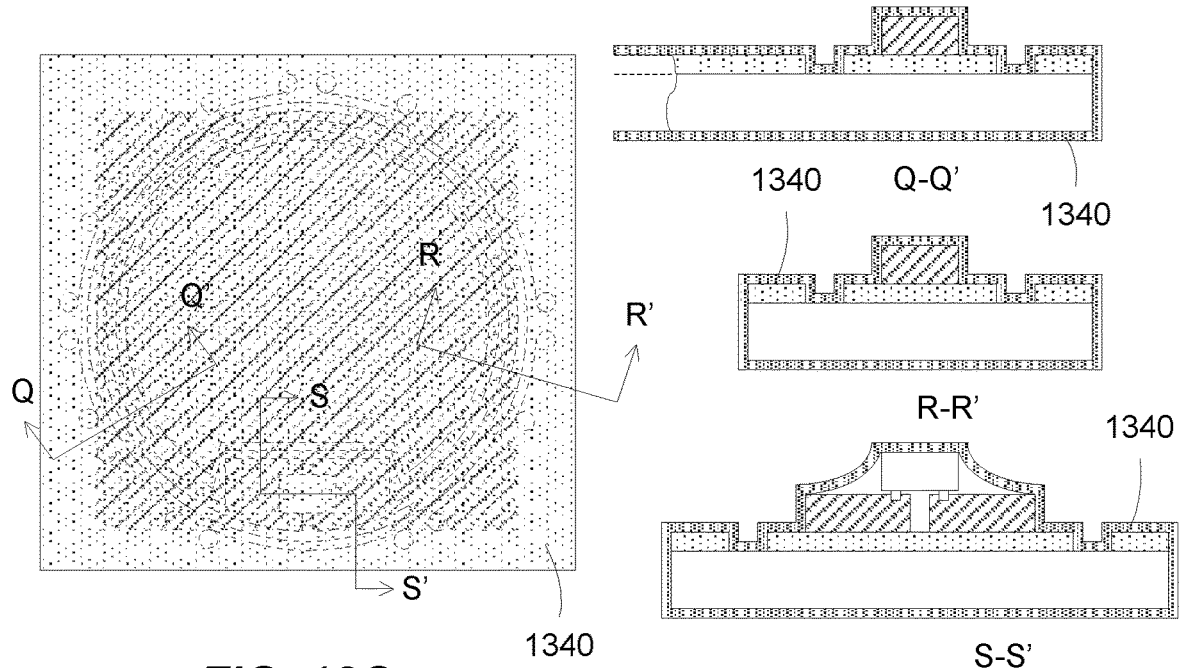

In FIG. 13C, an encapsulating coating can be deposited, for example, on all exposed sides of the substrate. For example, the encapsulating coating can cover the top surface, the bottom surface, the side surfaces caused by the precut, and the exposed surfaces of the adhesive and the substrate after the adhesive removal cut.

In some embodiments, the encapsulating coating can include a parylene deposition process. The conformal coating parylene is used widely to provide a uniform and consistent barrier against moisture, in particular for medical or biomedical applications. Parylene coating is a bio-stable, biocompatible pinhole free coating which has obtained FDA approval for various applications. It is chemically resistant coating with good barrier properties towards inorganic and organic media, strong acids, caustic solutions, gases and water vapor. In addition, it has a low leakage current and a low dielectric constant so can be utilized for electrical component protection.

The processing of parylene on a surface follows the general sequence of sublimation, pyrolysis and deposition. The coating cycle begins with vaporization of the powdered raw material (dimer) at 150° C., creating a dimeric gas of di-para-xylylene (sublimation). The di-para-xylylene gas molecules are subsequently cleaved to the monomer form para-xylylene in a second pyrolysis stage by heating to 650° C. (>550° C.). The active monomer gas is then introduced to an evacuated coating chamber where it disperses and polymerizes spontaneously on substrate surfaces at room temperature to form the parylene conformal layer coating (poly para-xylylene).

Figure 13D:
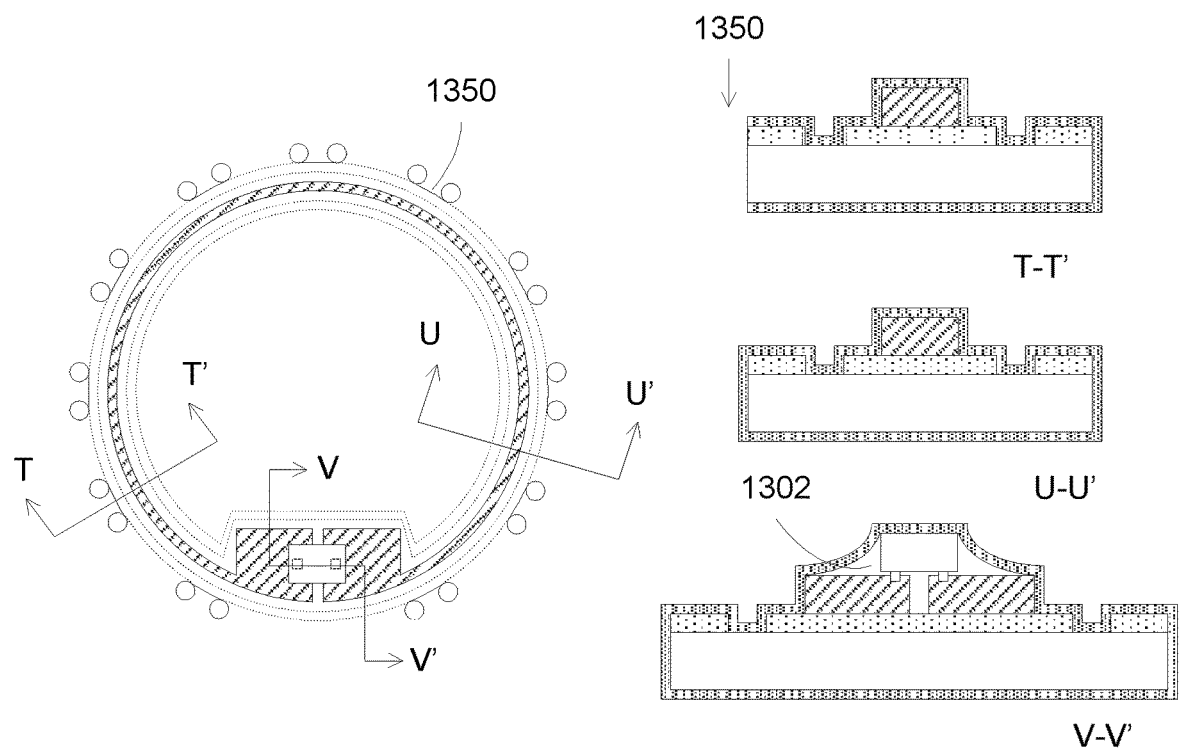

In FIG. 13D, a post cut 1350 is performed, for example, on the attached portion of the devices to the substrate. The post cut can singulate the devices from the substrate. The post cut can expose a side of the devices, e.g., there is no parylene barrier layer at the post cut area. However, since the adhesive layer near the post cut areas is previously removed in an adhesive removal cut, the impurity penetration path is blocked, and thus the reliability of the devices can be improved.

Different configurations of the adhesive removal cut can be used. As shown above, the adhesive removal cut can be a single cut, e.g., one cut at each side of the devices. Alternatively, multiple cuts can be used, such as two parallel cuts.

In some embodiments, the area around the chip can be protected by the precut 1390 and the adhesive removal cut. Thus the parylene encapsulating layer 1340 can cover the entire surface area of PET substrate 1310, the adhesive layer 1320, the aluminum layer (e.g., the antenna structure) and the chip. The parylene layer can also cover an anisotropic conductive paste (glue) 1302 that can be used to bond the chip to the antenna structure.

Figure 14A:
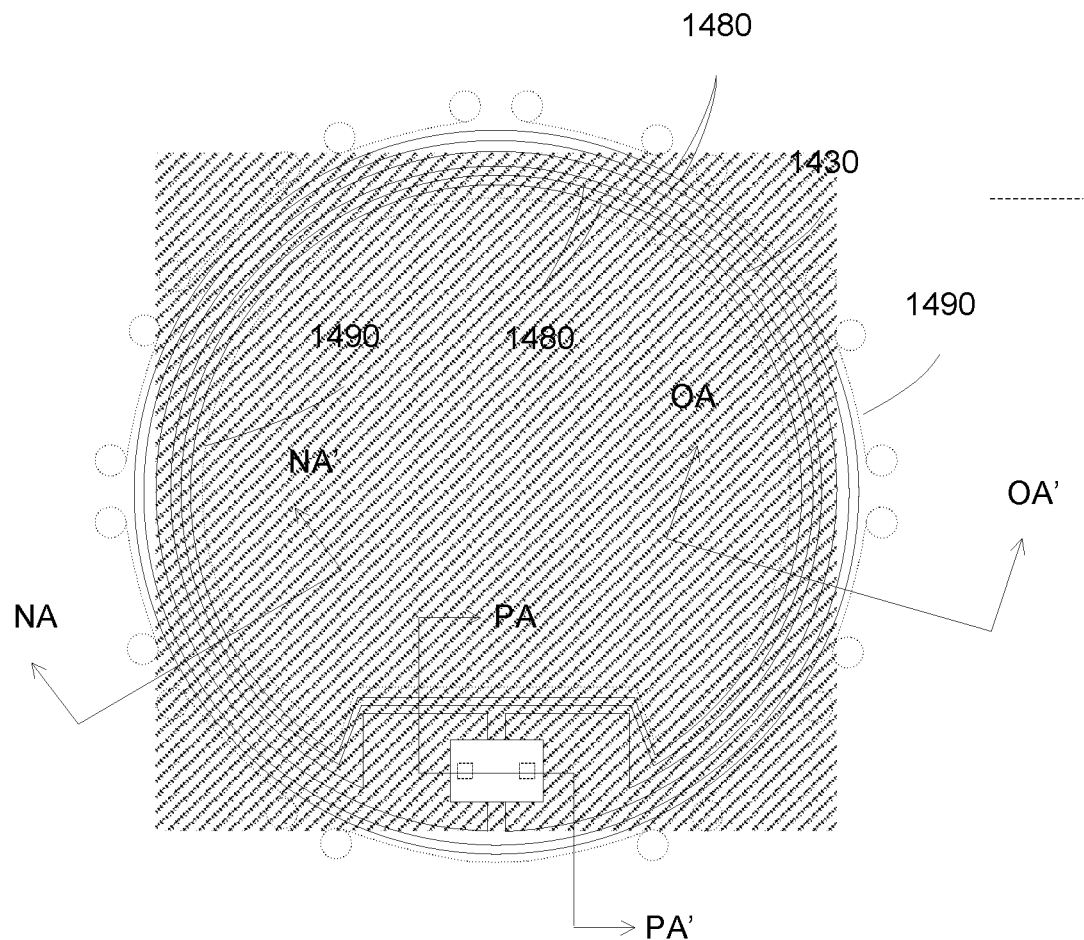
FIGS. 14A-14B illustrate top down views and side cross section views of a configuration of adhesive removal cut according to some embodiments.
Figure 14B:
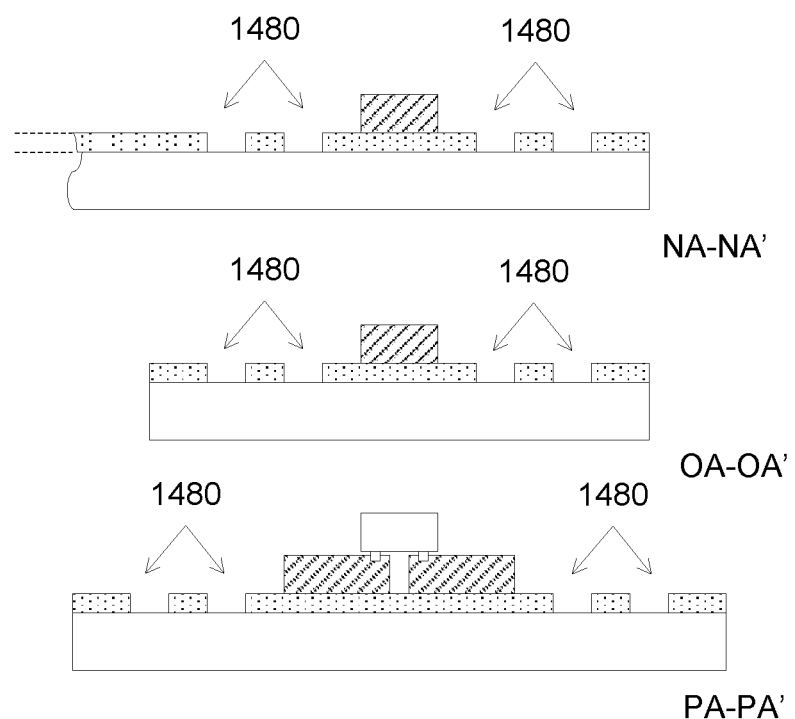

FIGS. 14A-14B illustrate a configuration of adhesive removal cut according to some embodiments. Two adhesive removal cuts 1480 can be performed at each side of the device 1430. For example, two parallel cut can be performed at an outer area of the device 1430, e.g., between the outer precut lines 1490 and the device 1430. Two parallel cut can be performed at an inner area of the device 1430, e.g., between the inner precut lines 1490 and the device 1430.

Other configurations can be used, such as three or more adhesive removal cut lines. In addition, there can be different number of adhesive removal cut lines at the outer and the inner sides of the devices. For example, as shown, the adhesive removal can be done with multiple passes on the surface of the PET substrate to create a multiple barrier layer and to prevent moisture ingress from the post cut area.

Figure 15:
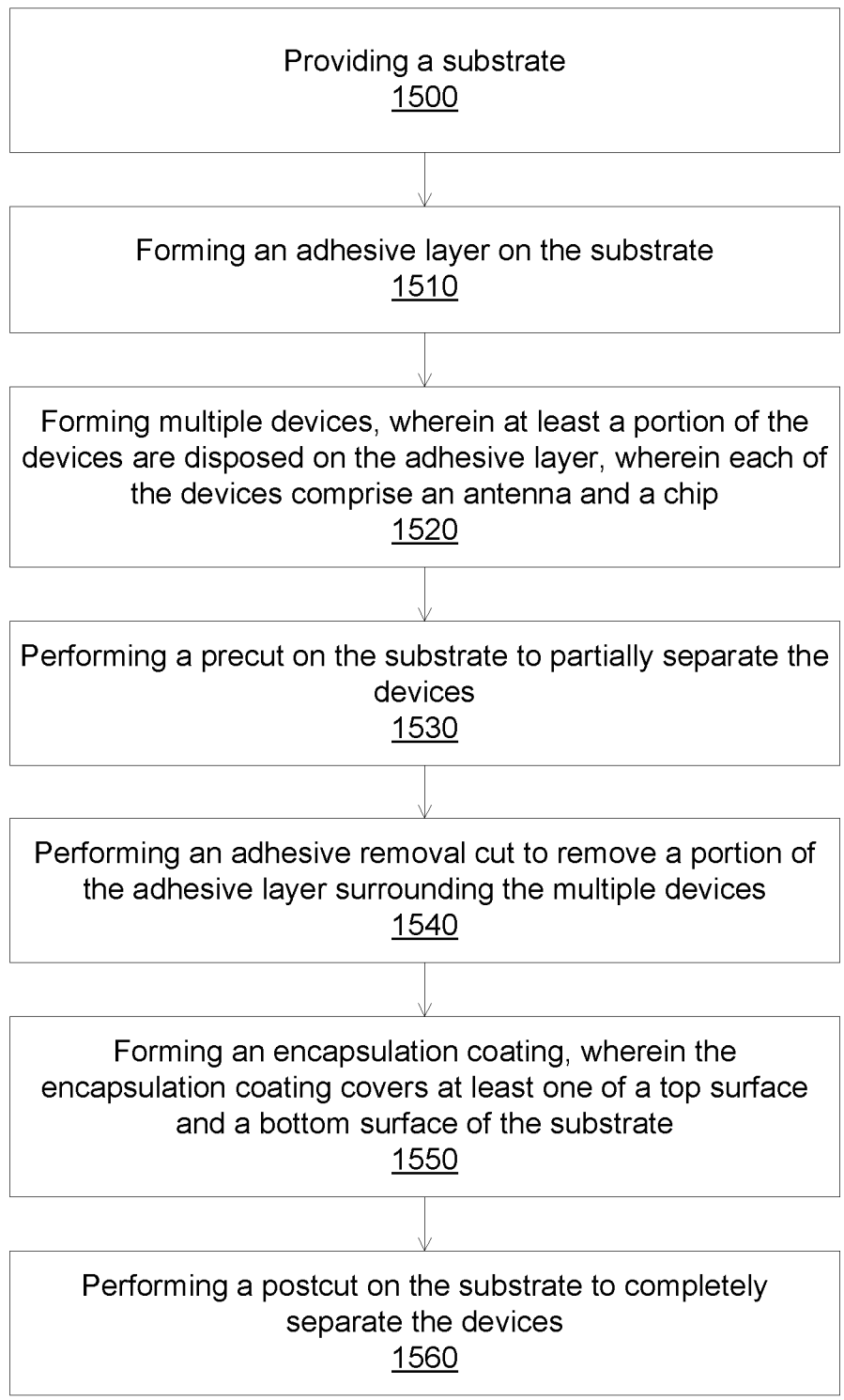
FIG. 15 illustrates a flow chart for the fabrication of RFID devices according to some embodiments.

FIG. 15 illustrates a flow chart for the fabrication of RFID devices according to some embodiments. Operation 1500 providing a substrate. Operation 1510 forms an adhesive layer on the substrate. Operation 1520 forms multiple devices, wherein at least a portion of the devices are disposed on the adhesive layer, wherein each of the devices comprise an antenna and a chip. Operation 1530 performs a precut on the substrate to partially separate the devices. Operation 1540 performs an adhesive removal cut to remove a portion of the adhesive layer surrounding the multiple devices. Operation 1550 forms an encapsulation coating, wherein the encapsulation coating covers at least one of a top surface and a bottom surface of the substrate. Operation 1560 performs a post cut on the substrate to completely separate the devices.

In some embodiments, the adhesive removal cut that complements the precut, e.g., the adhesive removal cut and the precut together can block the diffusion path to the devices. For example, the adhesive removal cut can start from a middle of a precut and end at a middle of an adjacent precut. Thus, though two adjacent precuts have a gap in between, the adhesive removal cut can block the gap, to ensure that the diffusion blocking is complete.

FIGS. 16A-16C illustrate a process for forming RFID devices having improved reliability according to some embodiments. In FIG. 16A, a substrate, such as a PET material, can also function as a web material for the roll-to-roll fabrication of RFID devices. Multiple RFID devices 1630 can be fabricated or attached on the substrate. In some embodiments, the substrate can include a layer of polymer adhesive, on which adhered a thin aluminum layer. The thin aluminum layer can be patterned to form an antenna structure for the RFID devices 1630. The antenna structure can include two large pads for bonding to bond pads of an RFID chip.

A precut process 1690 can be performed to partially singulate the devices. In a precut process, the substrate can be partially cut prior to the parylene deposition process. The cross sections K-K', L-L', and M-M' can be similar as in a previous figure.

In FIG. 16B, an adhesive removal cut 1680 can be performed to remove adhesive at areas that can provide a diffusion path to the devices. The laser removal area can be between the precut and any metal structures or chip bond structures of the devices. For example, the adhesive removal cut 1680 can be performed in an inner periphery of the devices. At an outer periphery, the adhesive removal cut 1680 can connect two adjacent precut lines, thus can complete a peripheral cut surrounding the devices. As shown, the adhesive removal areas is only used as a protection layer next to the precut, as this can allow equally good barrier protection to be achieved. The cross sections N-N', O-O', P-P' can be similar as in a previous figure.

In some embodiments, the precut and the adhesive removal cut can be performed in any order. For example, as shown, the precut is performed before the adhesive removal cut. Alternatively, the adhesive removal cut can be performed before the precut.

After the precut and the adhesive removal cut, an encapsulating coating can be deposited, for example, on all exposed sides of the substrate. For example, the encapsulating coating can cover the top surface, the bottom surface, the side surfaces caused by the precut, and the exposed surfaces of the adhesive and the substrate after the adhesive removal cut.

In FIG. 16C, a post cut 1650 is performed, for example, on the attached portion of the devices to the substrate. The post cut can singulate the devices from the substrate. The post cut can expose a side of the devices, e.g., there is no parylene barrier layer at the post cut area. However, since the adhesive layer near the post cut areas is previously removed in an adhesive removal cut, the impurity penetration path is blocked, and thus the reliability of the devices can be improved. The cross sections T-T', U-U', V-V' can be similar as in a previous figure.

Different configurations of the adhesive removal cut can be used. As shown above, the adhesive removal cut can be a single cut, e.g., one cut at each side of the devices. Alternatively, multiple cuts can be used, such as two parallel cuts.

In some embodiments, the adhesive removal can be done with multiple passes on the surface of the PET to create a multiple barrier layer and prevent impurity penetration, e.g., moisture ingress, from the post cut area.

Figure 17A:
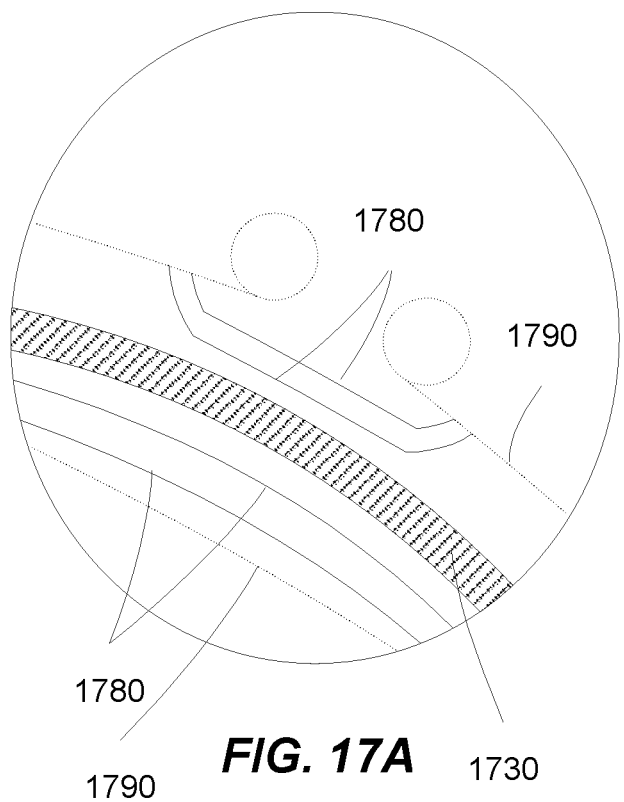
FIGS. 17A-17B illustrate section views of configurations of adhesive removal cut according to some embodiments.
Figure 17B:
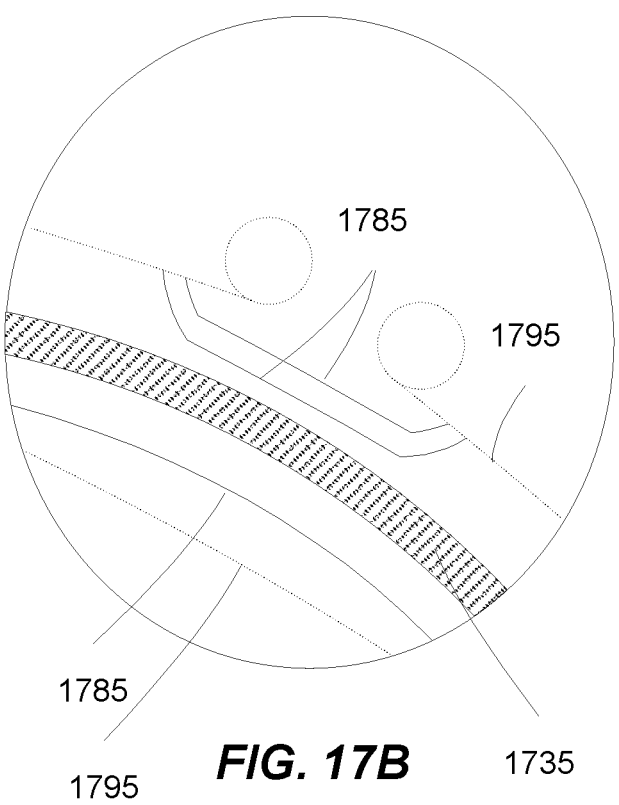

FIGS. 17A-17B illustrate configurations of adhesive removal cut according to some embodiments. In FIG. 17A, two adhesive removal cuts 1780 can be performed at each side of the device 1730. For example, two parallel cuts can be performed at an outer area of the device 1730, e.g., between the outer precut lines 1790 and the device 1730. Two parallel cuts can be performed at an inner area of the device 1730, e.g., between the inner precut lines 1790 and the device 1730.

In FIG. 17B, two adhesive removal cuts 1785 can be performed at the outer side of the device 1735, e.g., between the outer precut lines 1790 and the device 1730. One cut 1785 can be performed at an inner area of the device 1735, e.g., between the inner precut lines 1795 and the device 1735.

Other configurations can be used, such as three or more adhesive removal cut lines. In addition, there can be different number of adhesive removal cut lines at the outer and the inner sides of the devices. For example, as shown, the adhesive removal can be done with multiple passes on the surface of the PET substrate to create a multiple barrier layer and to prevent impurity penetration from the post cut area.

In some embodiments, there can be no precut. The singulation of the devices can occur in a complete post cut process. The adhesive removal cut can be completely surrounding the devices, to ensure a complete blocking of the diffusion or penetration path.

FIGS. 18A-18D illustrate a process for forming RFID devices having improved reliability according to some embodiments. The singulation process can include an adhesive removal cut and a post cut, without any precut. In FIG. 18A, a substrate, such as a PET material, can also function as a web material for the roll-to-roll fabrication of RFID devices. In some embodiments, the substrate can include a layer of polymer adhesive, on which adhered a thin aluminum layer. The thin aluminum layer can be patterned to form an antenna structure for the RFID devices 1830.

An adhesive removal cut 1880 can be performed to remove adhesive at areas that can provide an impurity penetration path to the devices. The laser removal area can surround any metal structures or chip bond structures of the devices. For example, the adhesive removal cut 1880 can be performed in an outer periphery and an inner periphery of the devices.

After the adhesive removal cut, an encapsulating coating can be deposited, for example, on all exposed sides of the substrate. For example, the encapsulating coating can cover the top surface, the bottom surface, the side surfaces caused by the precut, and the exposed surfaces of the adhesive and the substrate after the adhesive removal cut.

In FIG. 18B, a post cut 1850 is performed, for example, surrounding the devices to singulate the devices from the substrate. The post cut can expose a side of the devices, e.g., there is no parylene barrier layer at the post cut area. However, since the adhesive layer near the post cut areas is previously removed in an adhesive removal cut, the impurity penetration path is blocked, and thus the reliability of the devices can be improved.

Different configurations of the adhesive removal cut can be used. As shown above, the adhesive removal cut can be a single cut, e.g., one cut at each side of the devices. Alternatively, multiple cuts can be used, such as two parallel cuts.

FIG. 18C shows an alternative of the adhesive removal cut process. Two adhesive removal cuts can be performed at each side of the device 1830. For example, two parallel cuts 1881 (instead of one adhesive removal cut as found if other embodiments such as cut 1880 as found in FIG. B) can be performed at an outer area of the device 1830. Additionally, two parallel cuts 1882 can be performed at an inner area of the device 1830/

FIG. 18D shows another alternative of the adhesive removal cut process. Two adhesive removal cuts 1883 can be performed at the outer side of the device 1830. Additionally, one cut 1884 can be performed at an inner area of the device 1830.

It is noted that any combination of pre-cut and post-cut in any plurality can be made at any designated area.

Other configurations can be used, such as three or more adhesive removal cut lines. In addition, there can be different number of adhesive removal cut lines at the outer and the inner sides of the devices. For example, as shown, the adhesive removal can be done with multiple passes on the surface of the PET substrate to create a multiple barrier layer and to prevent moisture ingress from the post cut area.

In some embodiments, the adhesive removal cut can have a large width. For example, the laser beam can be defocused so that the adhesive removal area is enlarged. Alternatively, multiple laser passes can be performed next to each other, thus enlarging the width of the adhesive removal area. The adhesive removal area can begin at the edge of the devices, such as at the edge of the metal structure, e.g., the antenna. The adhesive removal area can end at the edge of the precut or post cut. For example, the adhesive removal cut can partially overlap the precut, if the precut is performed before the adhesive removal cut. Alternatively, the precut can partially overlap the adhesive removal cut, if the adhesive removal cut is performed before the precut. In addition, the post cut can partially overlap the adhesive removal cut.

FIGS. 19A-19C illustrate a process for forming RFID devices having improved reliability according to some embodiments. In FIG. 19A, a substrate, such as a PET material, can also function as a web material for the roll-to-roll fabrication of RFID devices. Multiple RFID devices 1930 can be fabricated or attached on the substrate. In some embodiments, the substrate can include a layer of polymer adhesive, on which adhered a thin aluminum layer. The thin aluminum layer can be patterned to form an antenna structure for the RFID devices 1930.

A precut process 1990 can be performed to partially singulate the devices. In a precut process, the substrate can be partially cut prior to the parylene deposition process.

In FIG. 19B, an adhesive removal cut 1980 can be performed to remove adhesive at areas that can provide a diffusion path to the devices. The laser removal area can be between the precut and any metal structures or chip bond structures of the devices. For example, the adhesive removal cut 1980 can be performed in an outer periphery and an inner periphery of the devices.

The cutting width of the adhesive removal cut can be controlled by the laser cutting process, for example, by running laser scans next to each other to increase the width of the laser cut. Alternatively, defocusing the laser beam can also enlarge the cutting width. As shown, the width of the adhesive removal cut is larger than a single laser cut, and can be disposed between the precut and the post cut. Alternatively, the adhesive removal cut can begin at the device 1930, can end at the precut or post cut, or can begin at the pre-cut or post-cut and end at the device 1930.

In some embodiments, the precut and the adhesive removal cut can be performed in any order. For example, as shown, the precut is performed before the adhesive removal cut. Alternatively, the adhesive removal cut can be performed before the precut.

As shown, the adhesive removal cut 1980 can provide a complete blocking of the impurity penetration path to the devices, e.g., even without the precut 1990. Other configurations can be used, such as an adhesive removal cut that complements the precut, e.g., the adhesive removal cut and the precut together can form a complete blocking of the diffusion, infiltration and penetration path to the devices. An encapsulating coating can be deposited, for example, on all exposed sides of the substrate.

In FIG. 19C, a post cut 1950 is performed, for example, on the attached portion of the devices to the substrate. The post cut can singulate the devices from the substrate.

Other configurations can also be used. For example, the large adhesive removal cut can begin at a precut and end at an adjacent precut. Or there can be no precut lines.

Figure 20A:
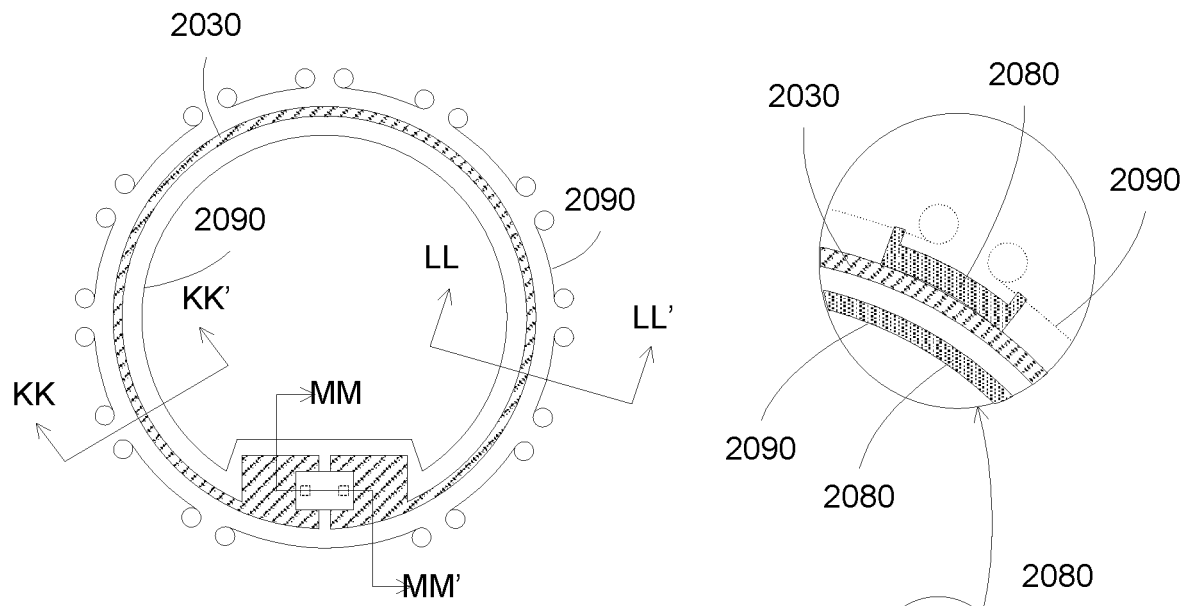
FIGS. 20A-20C illustrate top down views and section views of a process for forming RFID devices having improved reliability according to some embodiments.
Figure 20B:
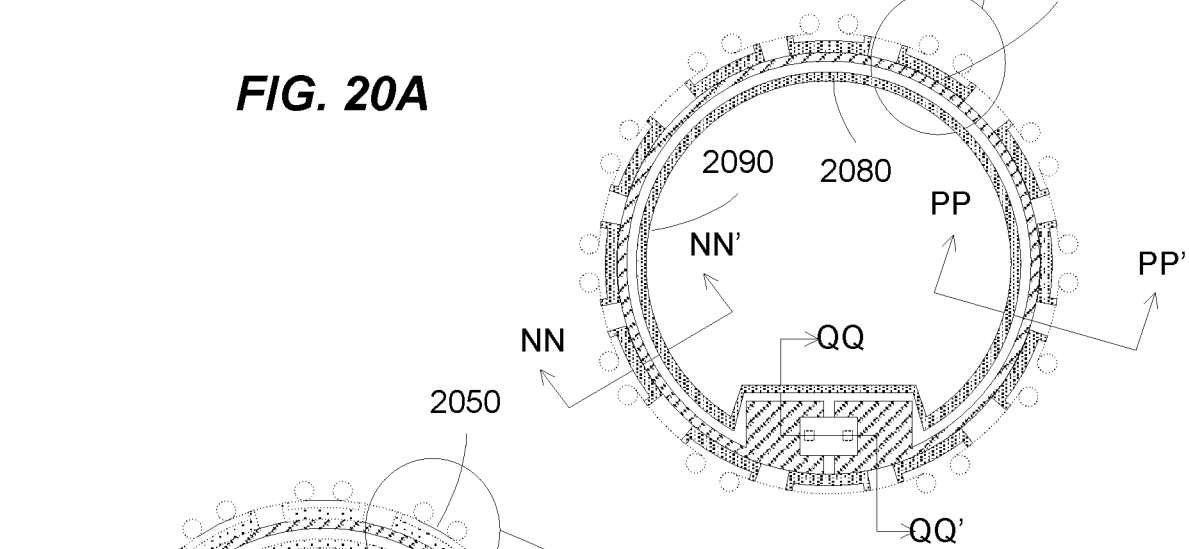
Figure 20C:
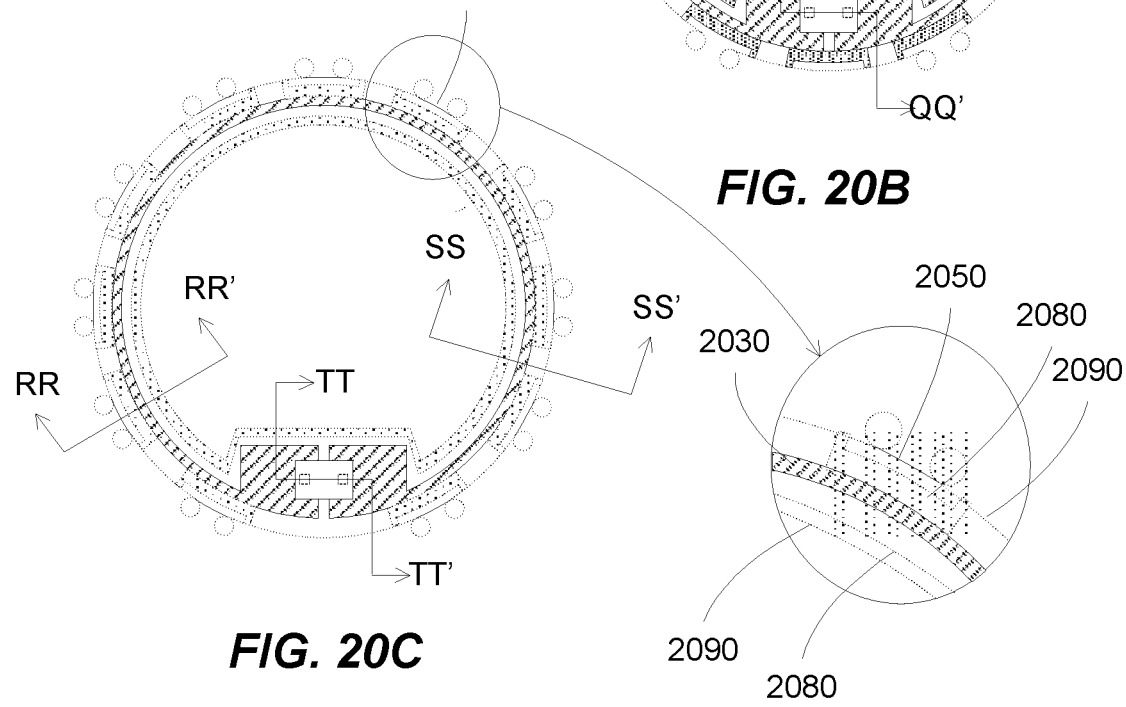

FIGS. 20A-20C illustrate a process for forming RFID devices having improved reliability according to some embodiments. The width of the adhesive removal cut can be large, e.g., larger than a width of a focus laser beam, which can be achieved by defocusing the laser beam or by running multiple passes next to each other (immediately adjacent or slightly overlapped). The adhesive removal cut can begin at a precut and end at an adjacent precut. As shown, the width of the adhesive removal cut is between the device and the post cut. Alternatively, the width of the adhesive removal cut can be adjacent to the device and/or the post cut.

In FIG. 20A, a substrate, such as a PET material, can also function as a web material for the roll-to-roll fabrication of RFID devices. Multiple RFID devices 2030 can be fabricated or attached on the substrate. In some embodiments, the substrate can include a layer of polymer adhesive, on which adhered a thin aluminum layer. The thin aluminum layer can be patterned to form an antenna structure for the RFID devices 2030. The antenna structure can include two large pads for bonding to bond pads of an RFID chip.

A precut process 2090 can be performed to partially singulate the devices. In a precut process, the substrate can be partially cut prior to the parylene deposition process.

In FIG. 20B, an adhesive removal cut 2080 can be performed to remove adhesive at areas that can provide a diffusion path to the devices. The adhesive removal cut 2080 can have a large width, for example, much larger than a beam width of the laser. The large width of the adhesive removal cut can be accomplished by running the laser with multiple passes next to each other.

After the precut and the adhesive removal cut, an encapsulating coating can be deposited, for example, on all exposed sides of the substrate. For example, the encapsulating coating can cover the top surface, the bottom surface, the side surfaces caused by the precut, and the exposed surfaces of the adhesive and the substrate after the adhesive removal cut.

In FIG. 20C, a post cut 2050 is performed, for example, on the attached portion of the devices to the substrate. The post cut can singulate the devices from the substrate. The post cut can expose a side of the devices, e.g., there is no parylene barrier layer at the post cut area. However, since the adhesive layer near the post cut areas is previously removed in an adhesive removal cut, the impurity penetration path is blocked, and thus the reliability of the devices can be improved.

Different configurations of the adhesive removal cut can be used. As shown above, the adhesive removal cut can be a single large cut, e.g., one cut at each side of the devices. Alternatively, multiple cuts can be used, such as two parallel cuts. Further, the width of the cuts can be larger or smaller. For example, the adhesive removal cut between the inner precut and the device can be between the edge of the inner precut and the edge of the device.

Figures 21A, 21B, 21C, 21D:
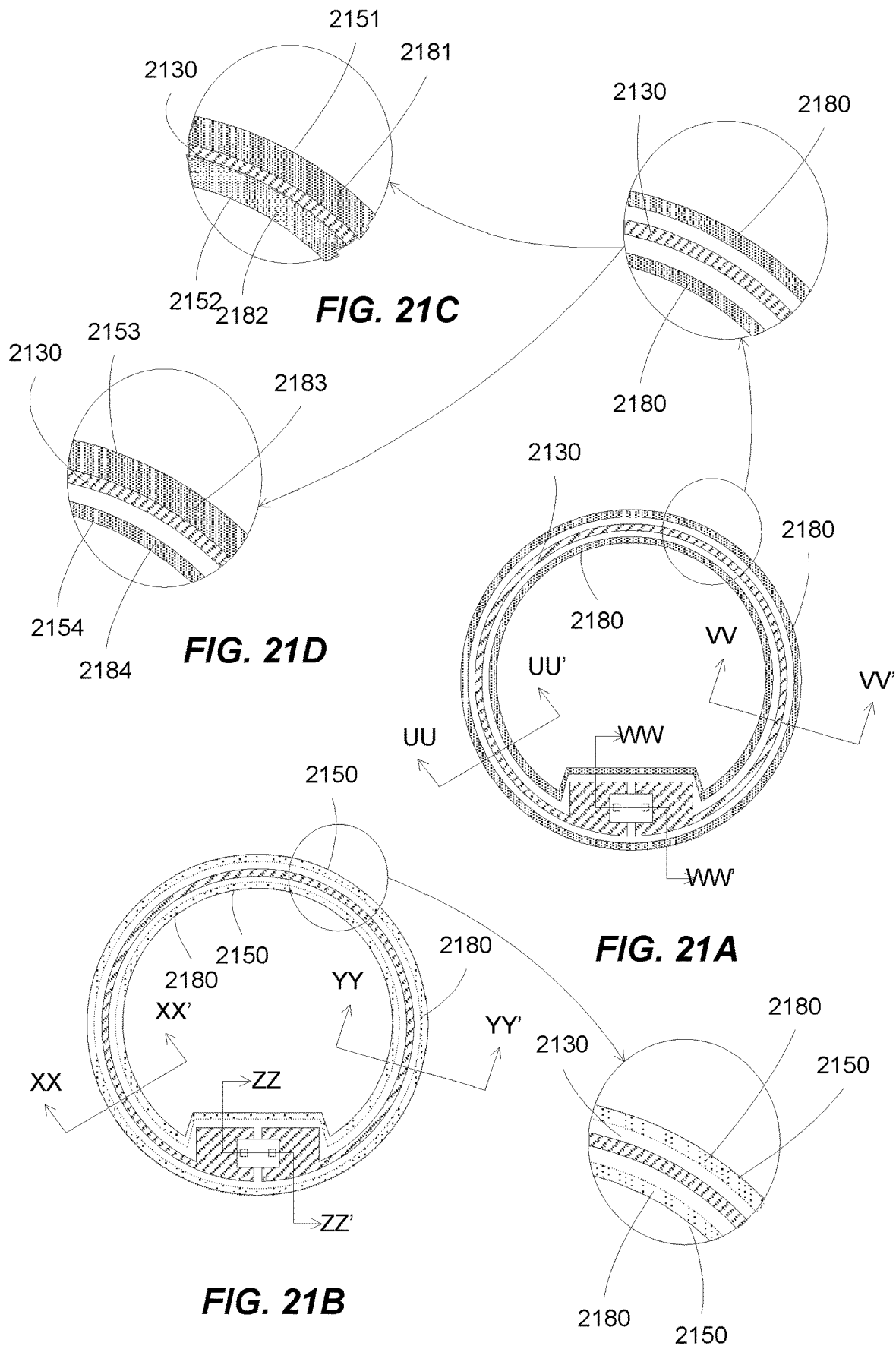
FIGS. 21A-21D illustrate top down views and section views of a process for forming RFID devices having improved reliability according to some embodiments.

FIGS. 21A-21C illustrate a process for forming RFID devices having improved reliability according to some embodiments. There is no precut. The width of the adhesive removal cut can be large, e.g., larger than a width of a focus laser beam, which can be achieved by defocusing the laser beam or by running multiple passes next to each other (immediately adjacent or slightly overlapped). As shown, the width of the adhesive removal cut lies below the width of the distance between the device and the post cut. Alternatively, the width of the adhesive removal cut being either adjacent to the device and/or to the post cut.

In FIG. 21A, a substrate, such as a PET material, can also function as a web material for the roll-to-roll fabrication of RFID devices. In some embodiments, the substrate can include a layer of polymer adhesive, on which adhered a thin aluminum layer. The thin aluminum layer can be patterned to form an antenna structure for the RFID devices 2130.

An adhesive removal cut 2180 can be performed to remove adhesive at areas that can provide an impurity penetration path to the devices. The adhesive removal cut 2180 can have a large width, for example, much larger than a beam width of the laser. The large width of the adhesive removal cut can be accomplished by running the laser with multiple passes next to each other. The laser removal area can surround any metal structures or chip bond structures of the devices. For example, the adhesive removal cut 2180 can be performed in an outer periphery and an inner periphery of the devices.

After the adhesive removal cut, an encapsulating coating can be deposited, for example, on all exposed sides of the substrate. For example, the encapsulating coating can cover the top surface, the bottom surface, the side surfaces caused by the precut, and the exposed surfaces of the adhesive and the substrate after the adhesive removal cut.

In FIG. 21B, a post cut 2150 is performed, for example, surrounding the devices to singulate the devices from the substrate. The post cut can expose a side of the devices, e.g., there is no parylene barrier layer at the post cut area. However, since the adhesive layer near the post cut areas is previously removed in an adhesive removal cut, the impurity penetration path is blocked, and thus the reliability of the devices can be improved.

Different configurations of the adhesive removal cut can be used. As shown above, the adhesive removal cut can be a single cut, e.g., one cut at each side of the devices. Alternatively, multiple cuts can be used, such as two parallel cuts.

FIG. 21C shows an alternative of the adhesive removal cut process. The width of the adhesive removal cut 2181 can be from the edge of the device 2130 to the edge of the outer post cut 2151. The width of the adhesive removal cut 2182 can be from the edge of the device 2130 to the edge of the inner post cut 2152.

FIG. 21D shows another alternative of the adhesive removal cut process. The width of the adhesive removal cut 2183 can be from the edge of the device 2130 to the edge of the outer post cut 2153. The width of the adhesive removal cut 2184 can be from the edge of the inner post cut 2152 to a location near the edge of the device 2130, e.g., there is a gap between the adhesive removal cut 2184 and the device 2130. It is noted that the widths, depths, gaps, and locations of any of the cuts can be of any characteristic or size depending on the embodiments, as well as any plurality. It is noted that those given in the Figures are purely for example and that one skilled in the art may see the application for a varied characteristic breadth. The cuts may also be made at other positions as well.

FIGS. 22A-22F illustrate top down component views of RFID configurations with at least one chip and at least one antenna according to some embodiments. Specifically, the FIGS. 22A-22F represent the ability of the present invention to have embodiments with any combination of at least one antenna and at least one chip, such as one chip having multiple antennas, or multiple chips having multiple antennas, and one antenna having multiple chips, etc.

Figure 22A:
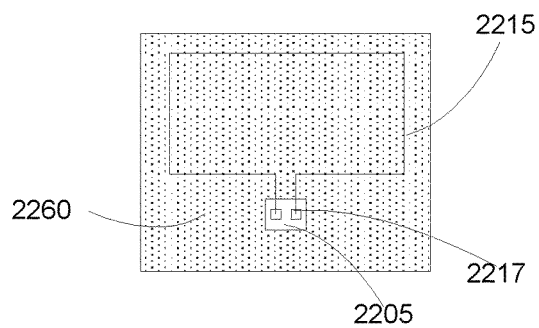
FIGS. 22A-22H illustrate top down component views of RFID configurations with at least one chip and at least one antenna according to some embodiments.

FIG. 22A teaches to an RFID having a single RFID chip and single antenna. The embodiment, having a substrate 2260 where a RFID chip 2205 is attached and wherein an antenna connects through a pair of antenna ports or nodes 2217 to the RFID chip.

Figure 22B:
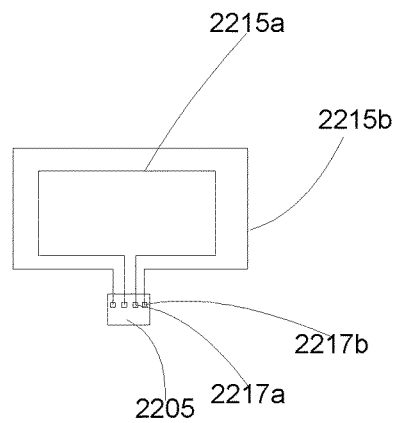

FIG. 22B teaches to a single RFID chip 205 having multiple antennas such as an antenna 2215a and an antenna 2215b, connected to the RFID chip at a pair of ports or nodes 2217a and 2217b, respectively. It is noted for this and any embodiment, the RFID chip, antenna and associated connections, nodes and other structures may be on a single substrate piece, their own substrate pieces respectively, or multiple substrate pieces, wherein some share a single substrate piece and others do not.

Figure 22C:
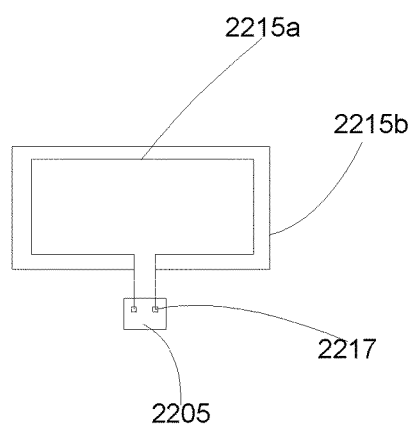

FIG. 22C teaches to a single RFID chip 2205 connected to two antennas, antenna 2215a and 2215b, both at the same single pair of nodes 2217, respectively.

Figure 22D:
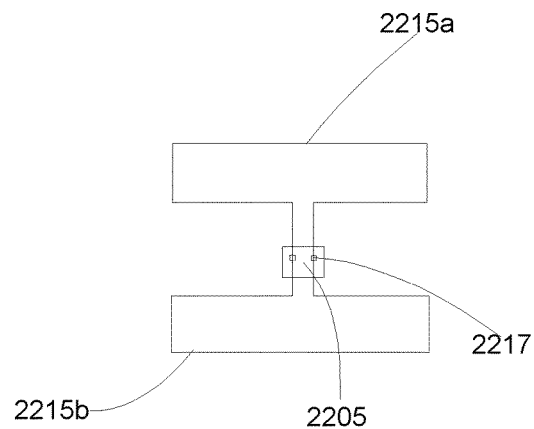

FIG. 22D teaches to a single RFID chip 2205 connected to two antennas, antenna 2215a and 2215b, both at the same single pair of nodes 2217, respectively with an alternate disposition of the antennas. It is noted that the chip or chips, antenna or antennas, connections, nodes and any other associated devices or structure may be of any location, disposition or area.

Figure 22E:
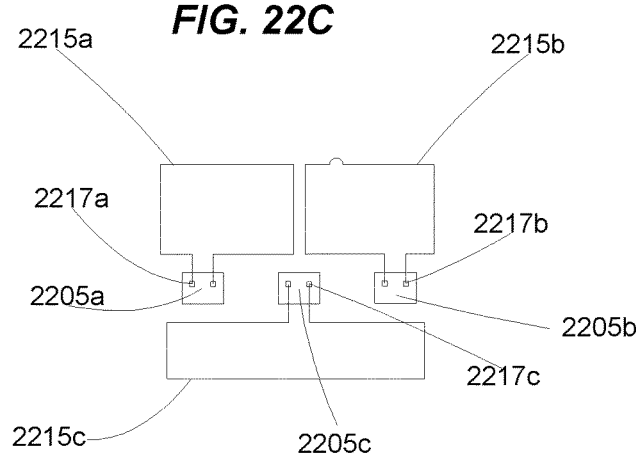

FIG. 22E teaches to multiple RFID chips 2205a, 2205b and 2205c connected each to their own antennas, 2215a, 2215b and 2215c, through each their own pair of nodes 2217a, 2217b and 2217c, respectively. It is noted that the location of the antenna and chips may be designed for maximum space or performance efficiencies.

Figure 22F:
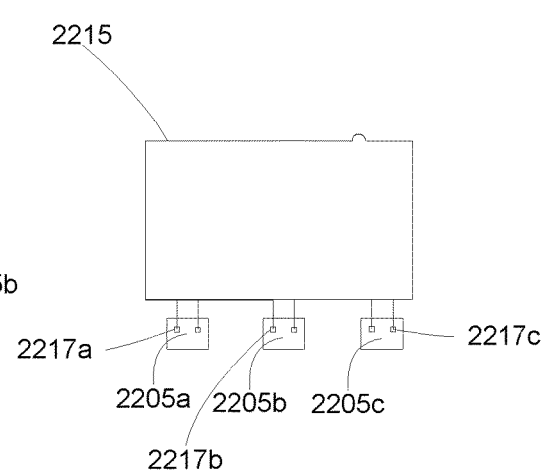

FIG. 22F teaches to multiple RFID chips 2205a, 2205b and 2205c connected to single antennas, 2215 through each of their own pair of nodes 2217a, 2217b and 2217c, respectively. It is again noted that any combination of antennas chips and nodes may be enlisted for any reason such as space or performance efficiencies.

Figure 22G:
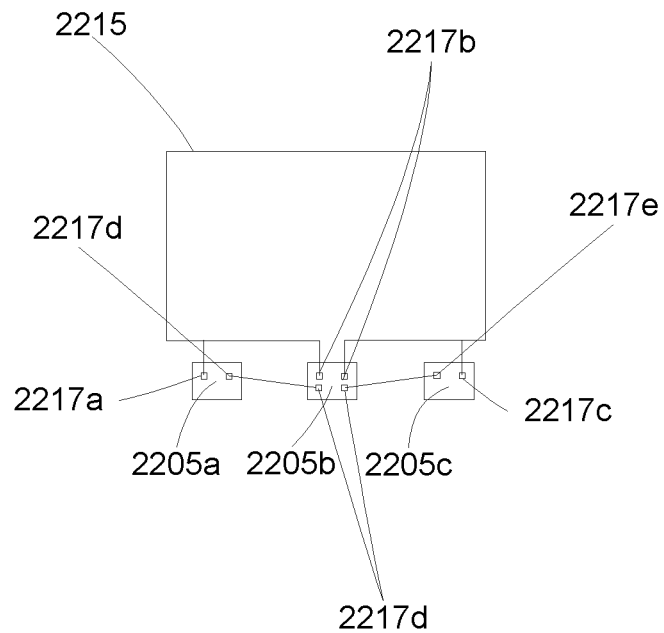

FIG. 22G teaches to multiple RFID chips 2205a, 2205b and 2205c connected to a single antenna 2215, wherein a main chip 2205b may connect to the antenna through ports 2217b, and wherein the auxiliary chips 2205a and 2205c, of which may be chips or other devices such as a power supply, battery, memory, sensor or otherwise, may connect to the main chip 2205b from ports 2217d and 2217e respectively to a single port, or as pictured multiple ports 2217d on main chip 2205b respectively. In addition, auxiliary chips or other devices 2205a and 2205c may connect directly to the main chip 2005b, but also to the antenna as a ground plane through ports 2217a and 2217c, respectively for chips or other devices 2205a and 2205c. It is noted that the auxiliary chips or other devices connecting to the antenna may not solely be a ground plane but in some other embodiments may be a direct connection. In an embodiment, and in different embodiments any combination of connection between one or more antennas one or more chips or devices, and of which any type of combination of connections may be taught. As example may be that an auxiliary chip or other devices connects directly to the main chip, wherein the main chip connects to the antenna, but in another embodiment the auxiliary chip or other devices in addition may connect to the antenna directly as well.

Figure 22H:
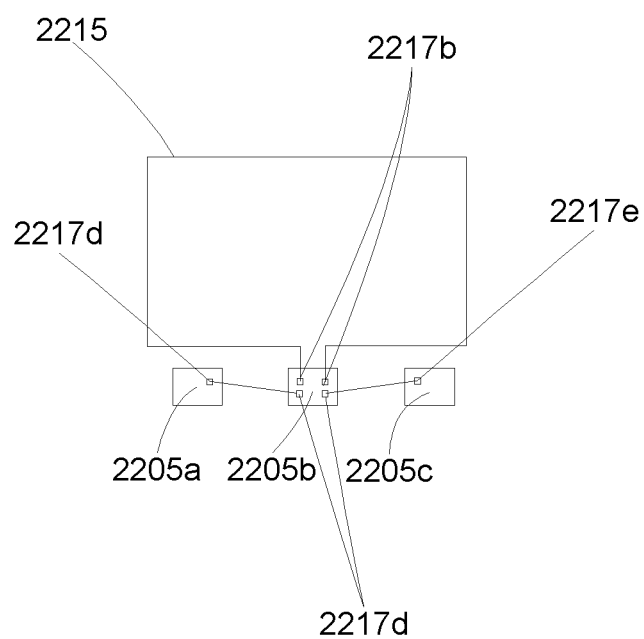

FIG. 22H teaches to an embodiment a main chip 2205b connects to an antenna 2215 through ports 2217b, and wherein there are auxiliary chips or other devices 2205a and 2205c, wherein the auxiliary chips or other devices connect to the main chips such as through ports 2217 and 2217e respectively, wherein they connect to a respective port 2217d on chips 2205B. It is noted that the connections may be of any plurality, combination and method or type, and that the ports may be multiple ports, single ports, and may be shared split, or of any plurality in any combination on any chips or device.

FIG. 23A-23I illustrate component diagrams views of some embodiments of varied antenna configuration compatible with the present invention system, method or apparatus.

Figure 23A:
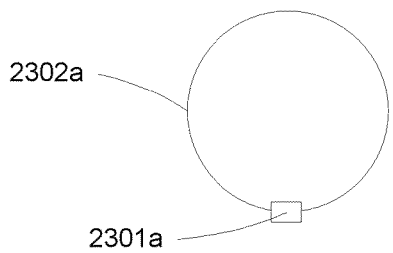
FIG. 23A-23I illustrate component diagrams views of some embodiments of varied antenna configuration compatible with the present invention system, method or apparatus.

FIG. 23A teaches to an embodiment with a standard loop configuration antenna 2302a and chip/device 2301a.

Figure 23B:
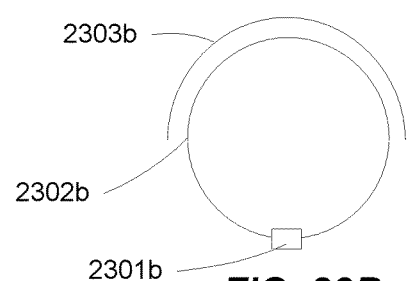

FIG. 23B teaches to an antenna structure in an embodiment with a chip/device 2301b with an antenna loop 2302b in resonance with a resonator or secondary radiator 2303b, such as to increase reading distance in either the near field or far field. It is noted that the structures in a preferred embodiment are not galvanic coupled, but in some embodiments may be.

Figure 23C:
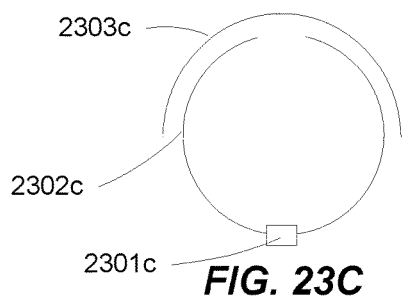

FIG. 23C teaches to an antenna structure in an embodiment with a chip/device 2301c with a split loop antenna 2302c in resonance with a secondary radiator or resonator 2303c. It is noted that the structures in a preferred embodiment are not galvanic coupled, but in some embodiments may be, as well as this applying to the other figure configurations as well as those unmentioned.

Figure 23D:
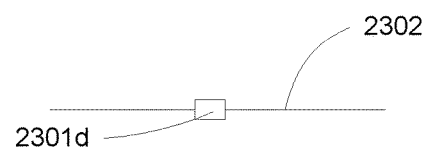

FIG. 23D teaches to an embodiment with a chip/device 2301d coupled with a dipole antenna 2302d, of which may be a dipole antenna or a stretched dipole antenna.

Figure 23E:
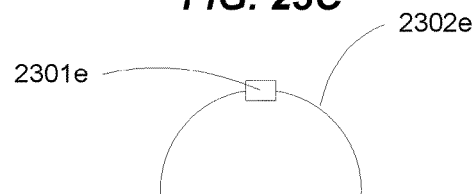

FIG. 23E teaches to an embodiment with a chip/device 2301e coupled to a curved dipole antenna 2302e.

Figure 23F:
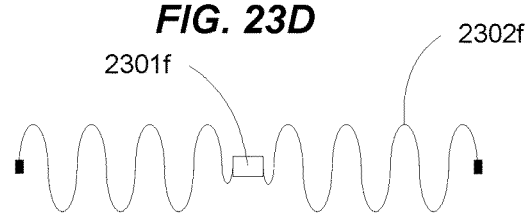

FIG. 23F teaches to an embodiment with a chip/device 2301f coupled to a folded dipole antenna 2302f.

Figure 23G:
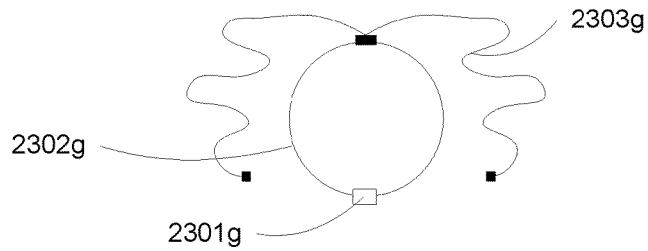

FIG. 23G teaches to an embodiment with a chip/device 2301g coupled to an antenna with an impedance matching loop 2302g, of which may be galvanically coupled with a dipole structure 2303g, forming the antenna. It is noted that in a preferred embodiment, the pieces are galvanically coupled but may not be in other embodiments.

Figure 23H:
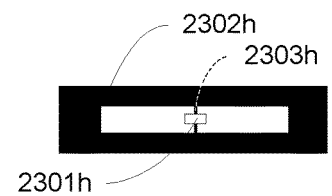

FIG. 23H teaches to a chip/device 2301h coupled to a slot, of which in some embodiment may be a slot antenna, 2302h. The chip connection jumps bridge the slot either directly or via chip linking conductor strips 2303h.

Figure 23I:
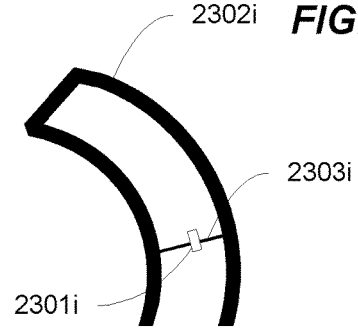

FIG. 23I teaches to a chip/device 2301i coupled to an antenna, of which in some embodiments may be an open slot antenna, 2302i. The chip connection jumps bridge the slot either directly or via chip linking conductor strips 2303i.

It is of special note that the coating or covering as mentioned in the present invention does not necessarily have to coat the entirety of the structures, in entirety, partially, or on a specific side. This is of special note when there are auxiliary structures, such as in FIG. 23B and FIG. 23C, where there is a secondary resonator, or secondary antenna, wherein the resonator or antenna may not necessarily be coated or be provided barrier, as the resonator or structure may not need protection. Or it is feasibly or unneeded, such as if the resonator was part of the larger structure or product, etc.

It is of note that the antenna configuration can include all form factors and antenna types, including those not mentioned above. It is especially noted that the plurality of connections between the any plurality of antennas, chips and devices may be to at least one antenna of any type or form. This may include coil, loop, split loop, dipole, folded dipole, curved dipole, as well as slot and open slots as well as any other type of antenna, transmitter or communication device. The breadth of the abilities for any of the embodiments, may include any plurality of antennas or combination of types of antennas, for different purposes, such as a loop and split loop antenna working simultaneously for long range and short range abilities.

Although the present embodiments have been described with reference to specific example embodiments, it will be evident that various modifications and changes may be made to these embodiments without departing from the broader spirit and scope of the various embodiments. It should be understood by one of ordinary skill in the art that the terms describing processes, products, elements, or methods are industry terms and may refer to similar alternatives In addition, the components shown in the figures, their connections, couples, and relationships, and their functions, are meant to be exemplary only, and are not meant to limit the embodiments described herein.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It may be appreciated that the various systems, methods, and apparatus disclosed herein may be embodied in a machine-readable medium and/or a machine accessible medium compatible with a data processing system (e.g., a computer system), and/or may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A method comprising:
providing multiple products on an adhesive layer on an substrate,
wherein:
the multiple products are individually disposed on the adhesive layer with a space between adjacent devices,
each of the multiple products comprises at least one RFID device which comprises multiple elements, wherein the multiple elements comprise:
a first element comprises at least one RFID antenna,
a second element comprises at least one RFID IC;
at least partially cutting out, in a partial cut, a product of the multiple products, wherein:
the partial cut exposes at least a portion of the adhesive layer to an ambient;
encapsulating at least the exposed portion, wherein:
an encapsulation material provides a barrier from the ambient for the exposed portion.

2. A method as in claim 1, wherein:
the partial cut only cuts through the adhesive layer, without cutting the substrate.

3. A method as in claim 2, wherein:
the partial cut comprises multiple paths for increasing a width of a removed portion of the adhesive layer caused by the partial cut.

4. A method as in claim 2, wherein:
the partial cut is performed by a laser configured to remove a portion of the adhesive layer,
the partial cut comprises a defocused laser for increasing a width of the removed portion of the adhesive layer.

5. A method as in claim 1, wherein:
the partial cut is performed surrounding the product.

6. A method as in claim 1, wherein:
the partial cut is performed in an outer periphery and an inner periphery of at least one product.

7. A method as in claim 1, wherein:
the partial cut cuts through the adhesive layer and a portion of the substrate, leaving the at least one product still attached to the substrate.

8. A method as in claim 1, wherein:
the partial cut comprises a first cut and a second cut, wherein:
at least a portion of the first cut is not overlapped with a portion of the second cut,
the first cut and the second cut surround at least a portion of the product,
the first cut cuts through the adhesive layer and through the substrate, and
the second cut cuts through the adhesive layer and not through the substrate.

9. A method as in claim 1, wherein:
the partial cut comprises a first cut and a second cut,
the first cut partially surrounds at least a portion of the product,
the second cut completely surrounds the product,
the first cut cuts through the adhesive layer and through the substrate, and
the second cut cuts through the adhesive layer and not through the substrate.

10. A method as in claim 1, wherein:
encapsulating leaves at least one sensor area on the product exposed to the ambient.

11. A method as in claim 1, wherein:
wherein encapsulating at least the exposed portion comprises:
sensing areas of the product for susceptibility to moisture penetration or to damage to the product,
encapsulating areas susceptible to moisture penetration or to damage.

12. A method as in claim 1, further comprising:
singulating the product from the substrate, wherein the singulation comprises a cut through the encapsulation layer and the substrate.

13. A method as in claim 1, wherein:
the RFID device comprises one or more ICs coupled to one or more antenna.

14. A method as in claim 1, further comprising:
sensing areas of the product for susceptibility to moisture penetration or to damage to the product,
encapsulating areas susceptible to moisture penetration or to damage.

15. A method as in claim 1, wherein:
the encapsulation material comprises parylene or a silicone polymer.

16. A method as in claim 1, wherein:
the encapsulation material is formed through a sequence of sublimation, pyrolysis and deposition, wherein the material polymerizes spontaneously to form the barrier.

17. A method as in claim 1, wherein:
the encapsulation material comprises multiple layers.

18. A method as in claim 14, wherein:
the encapsulation and singulation minimizes surface areas of the substrate exposed to the ambient, such that diffusion of moisture or gas through the substrate to the product and adhesive layer is reduced.

19. A method, comprising:
providing at least one product on an adhesive layer on a substrate,
wherein the at least one product comprises an RFID device,
wherein an area of the adhesive layer is exposed to an ambient or is capped by a protective layer,
wherein the area comprises at least a portion of a periphery of the at least one product;
removing the area of the adhesive layer,
wherein the removal exposes at least a portion of the adhesive layer to the ambient;
encapsulating at least the exposed portion.

20. A method comprising:
providing at least one product on an adhesive layer on a substrate, wherein the at least one product comprises an RFID device;
removing an area of the adhesive layer, wherein the area comprises at least a first portion of a first periphery of the at least one product,
cutting through the substrate along a second portion of a second periphery of the at least one product to partially separate the at least one product from the substrate,
wherein the removal occurs before or after the partial separation,
wherein the first periphery is the same or different from the second periphery,
wherein the removal or the partial separation exposes at least a portion of the adhesive layer to an ambient;
encapsulating at least the exposed portion.

* * * * *